US011164626B2

(12) United States Patent
Di Vincenzo et al.

(10) Patent No.: US 11,164,626 B2
(45) Date of Patent: Nov. 2, 2021

(54) METHODS AND SYSTEMS FOR ACCESSING MEMORY CELLS

(71) Applicant: Micron Technology, Inc., Boise, ID (US)

(72) Inventors: Umberto Di Vincenzo, Capriate San Gervasio (IT); Riccardo Muzzetto, Arcore (IT); Ferdinando Bedeschi, Biassono (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/771,657

(22) PCT Filed: Dec. 3, 2019

(86) PCT No.: PCT/IB2019/001204
§ 371 (c)(1),
(2) Date: Jun. 10, 2020

(65) Prior Publication Data
US 2021/0217471 A1    Jul. 15, 2021

(51) Int. Cl.
*G11C 11/00* (2006.01)
*G11C 13/00* (2006.01)

(52) U.S. Cl.
CPC .......... *G11C 13/004* (2013.01); *G11C 13/003* (2013.01); *G11C 13/0004* (2013.01); *G11C 13/0069* (2013.01); *G11C 2013/0045* (2013.01)

(58) Field of Classification Search
CPC . G11C 13/004; G11C 13/0004; G11C 13/003; G11C 13/0069; G11C 13/0045
See application file for complete search history.

(56) References Cited

U.S. PATENT DOCUMENTS 8,767,502 B2 * 7/2014 Kondo ................ G11C 11/4063
                                                      365/230.06
10,672,832 B2 * 6/2020 Ying .................... G11C 11/1675
(Continued)

OTHER PUBLICATIONS

PCT International Search Report and Written Opinion of the International Searching Authority for PCT/IB2019/001204, dated Aug. 28, 2020 (13 pages).

*Primary Examiner* — Pho M Luu
(74) *Attorney, Agent, or Firm* — Holland & Hart LLP

(57) ABSTRACT

A method for reading memory cell, comprising the steps of applying a first read voltage to a plurality of memory cells, detecting first threshold voltages exhibited by the plurality of memory cells in response to application of the first read voltage, based on the first threshold voltages, associating a first logic state to one or more cells of the plurality of memory cells, applying a second read voltage to the plurality of memory cells, wherein the second read voltage has the same polarity of the first read voltage and a higher magnitude than an expected highest threshold voltage of memory cells in the first logic state, detecting second threshold voltages exhibited by the plurality of memory cells in response to application of the second read voltage, based on the second threshold voltages, associating a second logic state to one or more cells of the plurality of memory cells, applying a third read voltage to the plurality of memory cells, wherein the third read voltage has the same polarity of the first and second read voltages and is applied at least to a group of memory cells that, during the application the second read voltage, have been reprogrammed to an opposite logic state, detecting third threshold voltages exhibited by the plurality of memory cells in response to application of the third read voltage, and based on the third threshold voltages, associating one of the first or second logic state to one or more of the cells of the of the plurality of memory (Continued)

cells. A related circuit, a related memory device and a related system are also disclosed.

24 Claims, 12 Drawing Sheets

(56) References Cited

U.S. PATENT DOCUMENTS

| | | |
|---|---|---|
| 2006/0209593 A1 | 9/2006 | Toda |
| 2009/0201740 A1 | 8/2009 | Willer et al. |
| 2011/0317486 A1 | 12/2011 | Lu et al. |
| 2014/0269046 A1* | 9/2014 | Laurin ................ H01L 27/2445 365/163 |
| 2017/0125097 A1 | 5/2017 | Tortorelli et al. |
| 2018/0138240 A1 | 5/2018 | Pellizzer |

* cited by examiner

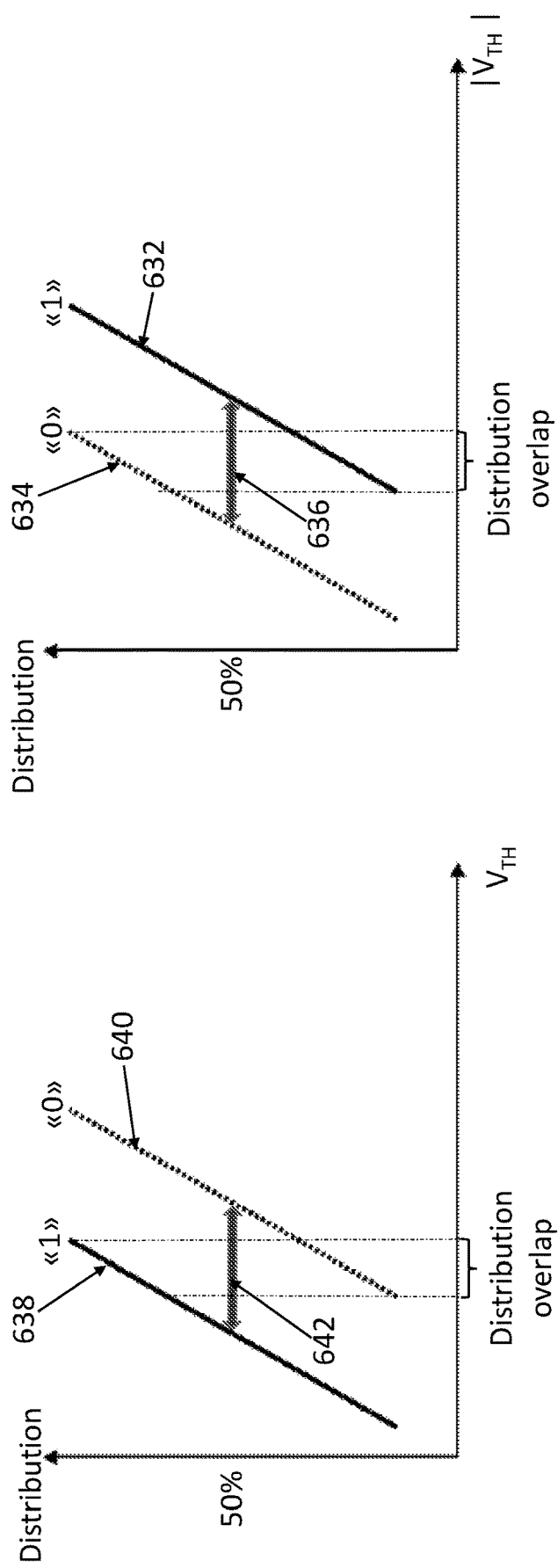

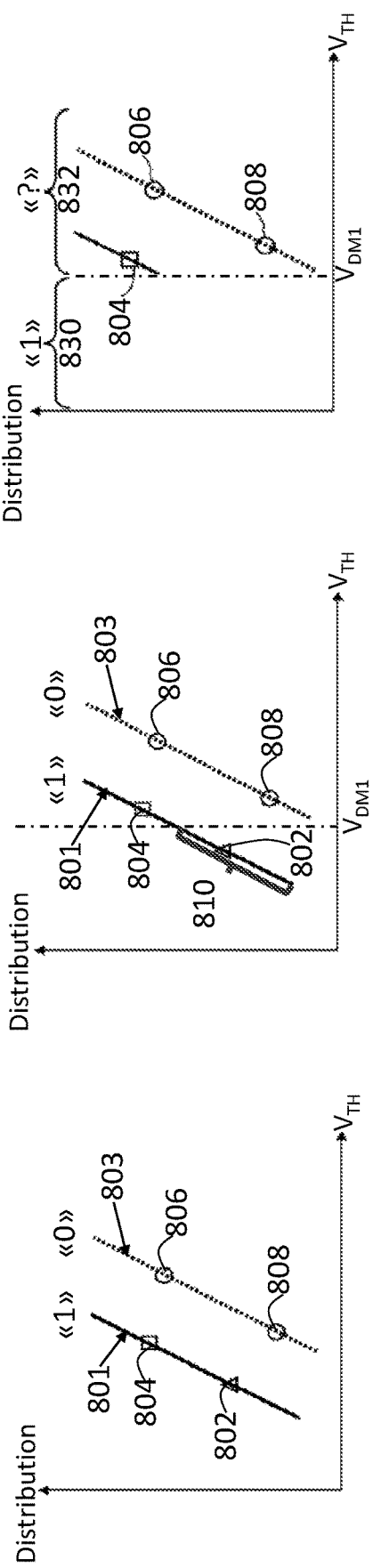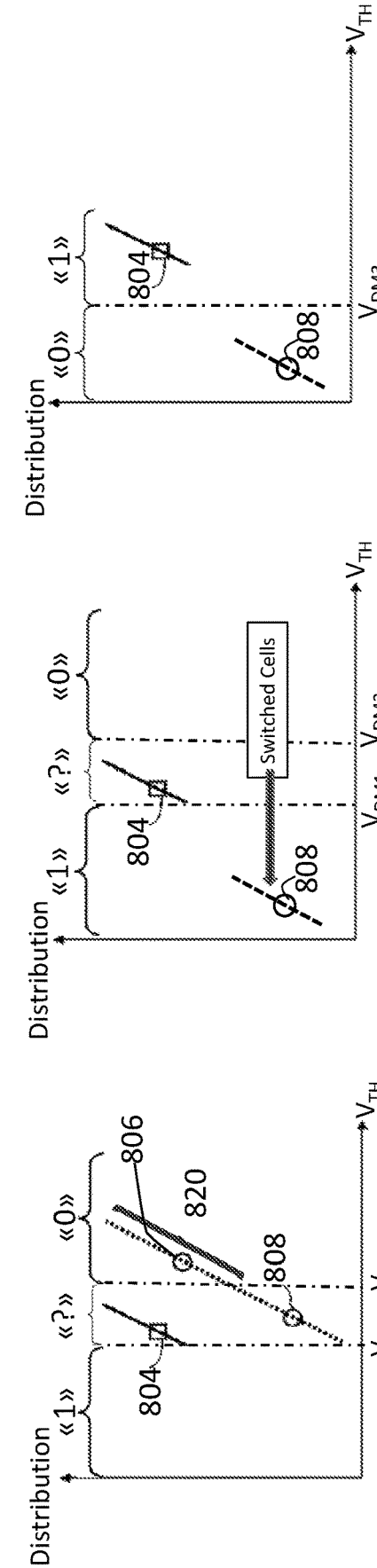

| Programming Logic State | Does cell undergo a threshold event after $V_{DM1}$? | Does cell undergo a threshold event after $V_{DM2}$? | Does cell undergo a threshold event after $V_{DM3}$? | Output Logic State |
|---|---|---|---|---|
| 1 (Range 810) | Yes | Masked | Masked | 1 |
| 0 (Range 820) | No | No | Masked | 0 |
| 1 | No | Yes | No | 1 |
| 0 | No | Yes | Yes | 0 |

FIG. 9

METHODS AND SYSTEMS FOR ACCESSING MEMORY CELLS

CROSS REFERENCE

The present Application for Patent is a 371 national phase filing of and claims priority to and the benefit of International Patent Application No. PCT/IB2019/001204 to Di Vincenzo et al., titled "METHODS AND SYSTEMS FOR ACCESSING MEMORY CELLS," filed Dec. 3, 2019, assigned to the assignee hereof, which is expressly incorporated herein by reference in its entirety.

TECHNICAL FIELD

The present disclosure relates to methods and systems for accessing memory cells, and more particularly for reading memory cells having different polarities.

BACKGROUND

Memory devices are used in many electronic systems such as mobile phones, personal digital assistants, laptop computers, digital cameras and the like. Nonvolatile memories retain their contents when power is switched off, making them good choices in memory devices for storing information that is to be retrieved after a system power-cycle.

Continued drive to smaller and more energy efficient devices has resulted in scaling issues with traditional memory devices. Thus, there is a current demand for memory devices that can potentially scale smaller than traditional memory devices. However, some memory technologies that scale smaller than traditional devices can experience relatively high rates of errors.

Traditional systems typically implement error detection and correction mechanisms to handle errors and prevent system crashes, loss of information, or both. However, error correction mechanisms can increase system cost, occupy space on a memory die, and increase the amount of time for accurate retrieval of data from memory. Such drawbacks can be especially significant for larger or more complex error correcting systems used for memories systems with high error rates.

It is therefore desirable to reduce in a simple manner the error rates in memory devices, particularly to reduce read errors.

BRIEF DESCRIPTION OF THE DRAWINGS

FIG. 6A is a graph illustrating a distribution of threshold voltages exhibited by a plurality of memory cells in response to a positive polarity read;

FIG. 6B is a graph illustrating a distribution of threshold voltages exhibited by a plurality of memory cells in response to a negative polarity read;

FIGS. 8A-8F are graphs illustrating distributions of threshold voltages exhibited by memory cells during the read sequence according to an embodiment of present disclosure;

FIG. 9 is a table illustrating the outcomes of the read sequence according to an embodiment the present disclosure;

DETAILED DESCRIPTION

With reference to those drawings, methods and systems for an improved read of memory cells will be disclosed herein.

Nonvolatile memories retain their contents when power is switched off, making them good choices for storing information that is to be retrieved after a system power-cycle. A Flash memory is a type of nonvolatile memory that retains stored data and is characterized by a very fast access time. Moreover, it can be erased in blocks instead of one byte at a time. Each erasable block of memory comprises a plurality of nonvolatile memory cells arranged in a matrix of rows and columns. Each cell is coupled to an access line and/or a data line. The cells are programmed and erased by manipulating the voltages on the access and data lines. Flash memories are well established and well suited for mass storage applications; however, their performances do not meet present day most demanding applications. New technologies, for example 3D Cross Point (3D XPoint) memories and Self-Selecting Memories (SSM) have better performances, for example in terms of access time and access granularity (data may be programmed and read with page, word or—in principle—even bit granularity). Accessing data during a read operation is more and more challenging with scaled technologies.

Figure 1:
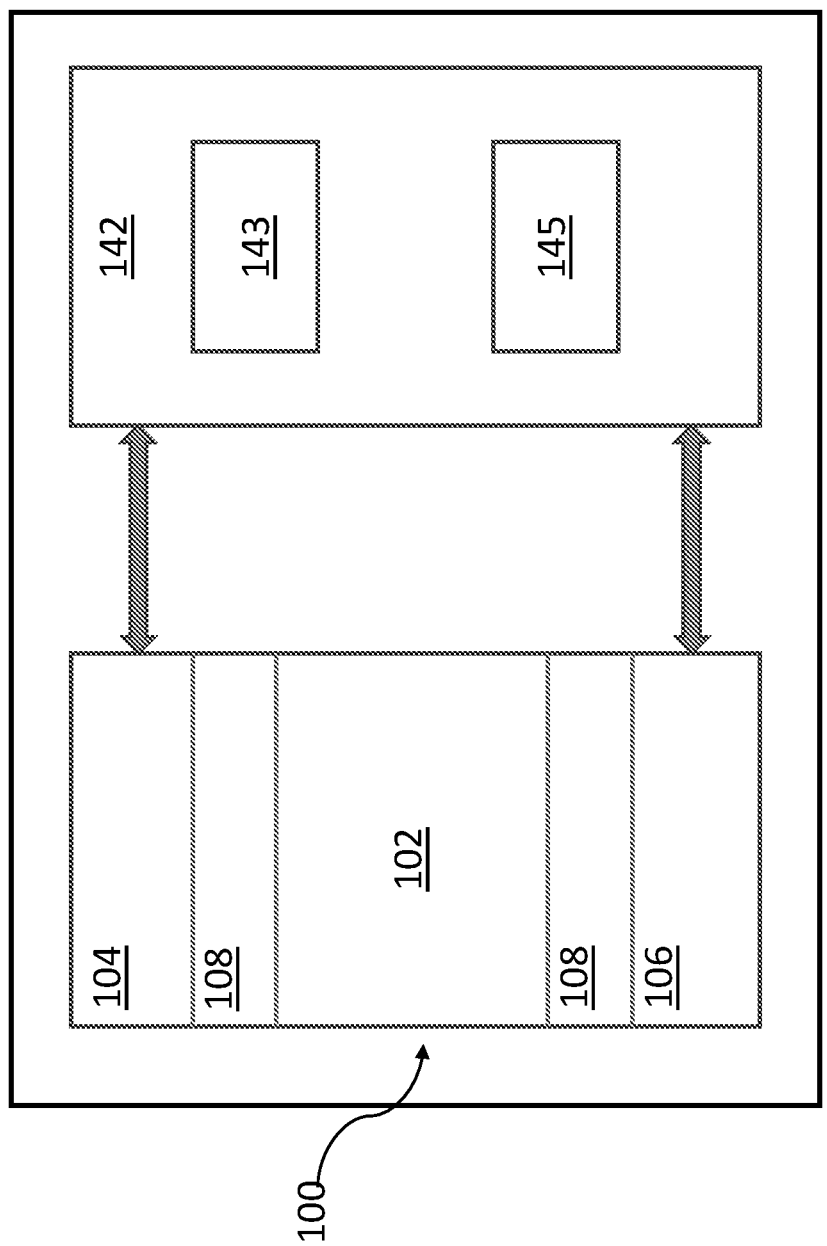
FIG. 1 is an exemplary block scheme illustrating an exemplary memory cell that can be read according to the present disclosure.

FIG. 1 illustrates a block scheme of an exemplary memory cell 100 that can be written and read according to the present disclosure.

In the embodiment illustrated in FIG. 1, the memory cell 100 includes a storage material 102 between access lines 104 and 106. The access lines 104, 106 electrically couple the memory cell 100 with circuitry 142 that writes to and reads the memory cell 100. The term "coupled" can refer to elements that are physically, electrically, and/or communicatively connected either directly or indirectly, and may be used interchangeably with the term "connected" herein. Physical coupling can include direct contact. Electrical coupling includes an interface or interconnection that allows electrical flow and/or signaling between components. Communicative coupling includes connections, including wired and wireless connections, that enable components to exchange data.

In one embodiment, the storage material 102 includes a self-selecting material that exhibits memory effects. A self-selecting material is a material that enables selection of a memory cell in an array without requiring a separate selector element. Thus, FIG. 1 illustrates the storage material 102 as a "selector/storage material." A material exhibits memory effects if circuitry for accessing memory cells can cause the material to be in one of multiple states (e.g., via a write operation), and later determine the programmed state (e.g., via a read operation). Circuitry for accessing memory cells (e.g., via read and write operations) is referred to generally as "access circuitry," and is discussed further below with reference to access circuitry 143. Access circuitry can store information in the memory cell 100 by causing the storage material 102 to be in a particular state. The storage material 102 can include, for example, a chalcogenide material such as Te—Se alloys, As—Se alloys, Ge—Te alloys, As—Se—Te alloys, Ge—As—Se alloys, Te—As—Ge alloys, Si—Ge—As—Se alloys, Si—Te—As—Ge alloys, or other material capable of functioning as both a storage element and a selector, to enable addressing a specific memory cell and determining what the state of the memory cell is. Thus, in one embodiment, the memory cell 100 is a self-selecting memory cell that includes a single layer of material that acts as both a selector element to select the memory cell and a memory element to store a logic state, i.e. a state related to a given polarity of the cell.

In one embodiment, the storage material 102 is a phase change material. A phase change material can be electrically switched between a generally amorphous and a generally crystalline state across the entire spectrum between completely amorphous and completely crystalline states. In another embodiment, the storage material 102 is not a phase change material. In one embodiment in which the storage material 102 is not a phase change material, the storage material is capable of switching between two or more stable states without changing phase. The access circuitry 143 is able to program the memory cell 100 by applying a voltage with a particular polarity to cause the storage material 102 to be in the desired stable state.

In one such embodiment, programming the memory cell 100 causes the memory cell 100 to "threshold" or undergo a "threshold event." When a memory cell thresholds (e.g., during a program voltage pulse), the memory cell undergoes a physical change that causes the memory cell to exhibit a certain threshold voltage in response to the application of a subsequent voltage (e.g., a read voltage with a particular magnitude and polarity). Programming the memory cell 100 can therefore involve applying a voltage of a given polarity to induce a programming threshold event, which causes the memory cell 100 to exhibit a particular threshold voltage at a subsequent reading voltage of a same or different polarity. In one such embodiment, the storage material 102 is a self-selecting material (e.g., a non-phase change chalcogenide material or other self-selecting material) that can be programmed by inducing a threshold event.

As it is explained in further detail below, the output of such a memory cell when read differs as a function of the polarity used to program the memory cell and the polarity used to read the memory cell. For example, the storage material 102 can exhibit a "lower threshold voltage" or a "higher threshold voltage" in response to a read voltage pulse based on the polarity of both the programming and read voltages. In the context of the present disclosure, exhibiting a threshold voltage means that there is a voltage across the memory cell that is approximately equal to the threshold voltage in response to the application of a voltage with a particular magnitude and polarity to the terminals of the memory cell. The threshold voltage thus corresponds to the minimum voltage that is needed to be applied at the input(s) to produce output(s), i.e. to see a determined electrical response of the cell. In other words, in the context of the present disclosure, the verb "threshold" means that the cells undergo a threshold event, i.e. they have an electrical response in response to the applied voltage that is above a given threshold, thus exhibiting a peculiar threshold voltage.

As mentioned above, the access lines 104, 106 electrically couple the memory cell 100 with circuitry 142. The access lines 104, 106 can be referred to as a bitline and wordline, respectively. The wordline is for accessing a particular word in a memory array and the bitline is for accessing a particular bit in the word. The access lines 104, 106 can be composed of one or more metals including: Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicide nitrides including TiSiN and WSiN; conductive metal carbide nitrides including TiCN and WCN, or any other suitable electrically conductive material.

In one embodiment, electrodes 108 are disposed between storage material 102 and access lines 104, 106. Electrodes 108 electrically couple access lines 104, 106 with storage material 102. Electrodes 108 can be composed of one or more conductive and/or semiconductive materials such as, for example: carbon (C), carbon nitride ($C_xN_y$); n-doped polysilicon and p-doped polysilicon; metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; conductive metal oxides including $RuO_2$, or other suitable conductive materials. In one embodiment, conductive wordline layer can include any suitable metal including, for example, metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN, or another suitable electrically conductive material.

Referring again to the circuitry 142, the access lines 104, 106 communicatively couple the circuitry 142 to the memory cell 100, in accordance with an embodiment. The circuitry 142 includes access circuitry 143 and sense circuitry 145. Circuitry includes electronic components that are electrically coupled to perform analog or logic operations on received or stored information, output information, and/or store information. Hardware logic is circuitry to perform logic operations such as logic operations involved in data processing. In one embodiment, the access circuitry 143 applies voltage pulses to the access lines 104, 106 to write to or read the memory cell 100. The terms "write" and "program" are used interchangeably to describe the act of storing information in a memory cell. To write to the memory cell 100, the access circuitry applies a voltage pulse with a particular magnitude and polarity to the access lines 104, 106, which can both select memory cell 100 and program memory cell 100.

In one embodiment, the access circuitry 143 applies a pulse with one polarity to program the memory cell 100 to be in one logic state, and applies a pulse with a different polarity to program the memory cell 100 to be in a different logic state. The access circuitry 143 can then differentiate between different logic states as a consequence of the programming polarity of a memory cell. For example, in a case of a memory read, the access circuitry 143 applies a voltage pulse with a particular magnitude and polarity to the access lines 104, 106, which results in an electrical response that the sense circuitry 145 can detect. Detecting electrical responses can include, for example, detecting one or more of: a voltage drop (e.g., a threshold voltage) across terminals of a given memory cell of the array, current through the given memory cell, and a threshold event of the given memory cell. In some cases, detecting a threshold voltage for a memory cell can include determining that the cell's threshold voltage is lower than or higher than a reference voltage, for example a read voltage. The access circuitry 143 can determine the logic state of the memory cell 100 based on electrical responses to one or more of the voltage pulses in the read sequence.

The memory cell 100 is one example of a memory cell. Other embodiments can include memory cells having additional or different layers of material than illustrated in FIG. 1 (e.g., a thin dielectric material between the storage material and access lines).

Figure 2:
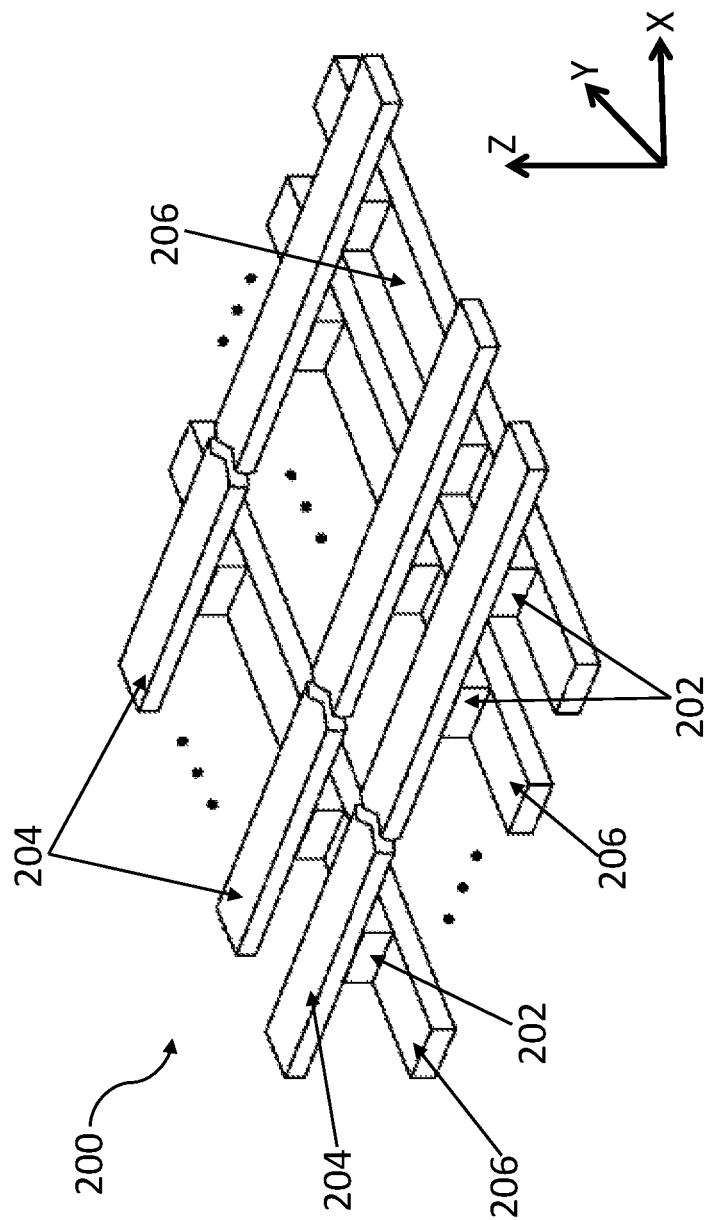
FIG. 2 schematically illustrates a portion of an exemplary memory cell array.

FIG. 2 shows a portion of a memory cell array 200, which can include a memory cell such as the memory cell 100 of FIG. 1, in accordance with an embodiment. Memory cell array 200 is an example of a three-dimensional cross-point memory structure (3D X Point). The memory cell array 200 includes a plurality of access lines 204, 206, which can be the same or similar as the access lines 104, 106 described with respect to FIG. 1. Access lines 204, 206 can be referred to as bitlines and wordlines. In the embodiment illustrated in FIG. 2, the bitlines (e.g., access lines 204) are orthogonal to the wordlines (e.g., access lines 206). A storage material 202 (such as the storage material 102 of FIG. 1) is disposed between the access lines 204, 206. In one embodiment, a "cross-point" is formed at an intersection between a bitline, a wordline. A memory cell is created from the storage material 202 between the bitline and wordline where the bitline and wordline intersect. The storage material 202 can be a chalcogenide material such as the storage material 102 described above with respect to FIG. 1. In one embodiment, the access lines 204, 206 are composed of one or more conductive materials such as the access lines 104, 106 described above with respect to FIG. 1. Although a single level or layer of memory cells is shown in FIG. 2, memory cell array 200 can include multiple levels or layers of memory cells (e.g., in the z-direction). Generally speaking, the intersection defines the address of the memory cell.

FIGS. 1 and 2 illustrate an example of a memory cell and array. However, other memory cell structures and arrays may be used, in which the memory cells exhibit electrical responses that vary as a function of programming and read polarity.

Figure 3:
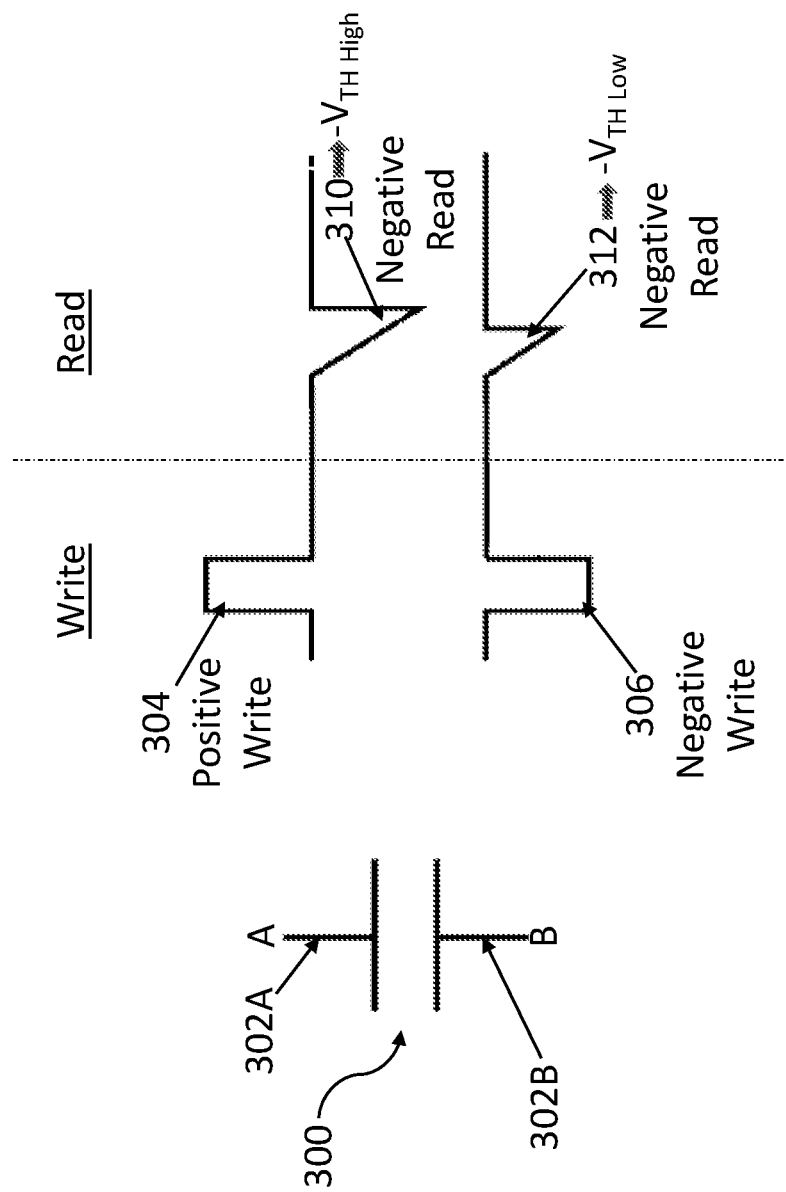
FIG. 3 schematically illustrates a single polarity read with a negative polarity of a memory cell.

FIG. 3 schematically shows how the polarity of programming and read voltage pulses can affect the threshold voltage exhibited by a memory cell such as the memory cell 100 of FIG. 1. More particularly, FIG. 3 is a diagram illustrating an example of single-polarity read of a memory cell.

More in particular, in the example of FIG. 3, a memory cell 300 has terminals 302A, 302B (labeled A and B, respectively) for accessing the memory cell 300. In one embodiment, terminals A and B are access lines, such as the access lines 104 and 106 of FIG. 1 or access lines 204 and 206 of FIG. 2. Access circuitry (such as the access circuitry 143 referred to in FIG. 1) can write to or read the memory cell 300 by applying a voltage having a particular magnitude and polarity to the terminals 302A, 302B of the memory cell.

For example, FIG. 3 shows a "positive" programming pulse 304 and a "negative" programming pulse 306. A positive programming pulse refers to a programming pulse with "positive polarity," which can also be referred to as "forward polarity." A negative programming pulse is a voltage pulse with "negative polarity," which can also be referred to as "reverse polarity." Whether or not a programming pulse is positive or negative is based on the relative voltages applied to the terminals 302A, 302B. A voltage pulse can be defined as positive if the voltage applied to one of the terminals is more positive than the voltage applied to a second of the terminals. For example, referring to FIG. 3, a positive voltage pulse can include: a positive voltage applied to terminal 302A and a negative voltage applied to terminal 302B; a positive voltage applied to terminal 302A and 0 V (e.g., circuit ground or neutral reference) applied to terminal 302B; 0V applied to terminal 302A and a negative voltage applied to terminal 302B, a positive voltage applied to both terminals 302A and 302B, but where the voltage applied to 302A is greater than the voltage applied to 302B; or a negative voltage applied to both terminals 302A and 302B, but where the voltage applied to 302A is greater than the voltage applied to 302B.

In such an embodiment, a voltage pulse applied to the terminals of the memory cell would be negative if the voltage applied to terminal 302A is more negative than the voltage applied to terminal 302B. For example, a negative voltage pulse can include: a negative voltage applied to terminal 302A and a positive voltage applied to terminal 302B; a negative voltage applied to terminal 302A and 0 V (e.g., circuit ground or neutral reference) applied to terminal 302B; 0V applied to terminal 302A and a positive voltage applied to terminal 302B, a negative voltage applied to both terminals 302A and 302B, but where the magnitude of the voltage applied to 302A is greater than the magnitude of the voltage applied to 302B; or a positive voltage applied to both terminals 302A and 302B, but where the magnitude of the voltage applied to 302B is greater than the magnitude of the voltage applied to 302A.

FIG. 3 shows a particular definition of "positive" and "negative" relative to terminals 302A, 302B for illustrative purposes, however, embodiments can define positive and negative differently. For example, an embodiment can define a positive programming pulse to be a voltage pulse in which the voltage applied to terminal 302B is more positive than the voltage applied to terminal 302A.

As mentioned above, access circuitry can both write to and read a memory cell by applying a voltage with a particular magnitude and polarity to the cell. In one embodiment, access circuitry can write different values or logic states to the memory cell by applying voltages with different polarities. For example, the access circuitry can apply a positive programming pulse (e.g., positive programming pulse 304) to write one logic state, and a negative programming pulse (e.g., negative programming pulse 306) to write a different logic state.

For ease of reference, the following description refers to a positive programming pulse as writing a "logic 1" to memory cell, and a negative programming pulse as writing a "logic 0" to a memory cell, although a different convention can be adopted. For example, in one embodiment, access circuitry can apply a negative programming pulse to write a logic 1 and a positive programming pulse to write a logic 0. According to the present disclosure, the cell can thus have at least two logic states.

Whether or not a voltage applied to a memory cell programs the cell depends upon the magnitude and duration of the applied voltage. For example, in one embodiment, access circuitry applies a programming pulse, such as the programming pulse 304 or 306, with a magnitude sufficient to cause the memory cell to threshold. For example, in one embodiment, the access circuitry can apply a voltage with a magnitude that is greater than or equal to the highest expected threshold voltage exhibited by the memory cell. In some embodiments the duration of a programming voltage pulse is 10 ns-50 ns. In some embodiments, the duration of the programming voltage pulse is 1-100 ns. In some embodiments, the duration of the programming voltage pulse is 1 ns-1 µs. In one embodiment, the duration of programming pulses and read pulses is the same.

Different embodiments can involve applying read and write voltage pulses of different shapes. In the embodiment illustrated in FIG. 3, the programming pulses 304 and 306 are shown as box-shaped pulses (also known as rectangular-shaped or square-shaped pulses), and the read pulses 310, 312 are shown as ramped pulses. In one embodiment, the read pulses 310, 312 ramp up or down to a read voltage magnitude (e.g., to $-V_{TH}$ High and $-V_{TH}$ Low in the embodiment illustrated in FIG. 3). In actual implementations, the voltage pulses may have leading or trailing edges, in accordance with embodiments. Other embodiments can apply write and read pulses having shapes such as triangular (e.g., ramped pulses), trapezoidal, rectangular, box, and/or sinusoidal shapes. Thus, circuitry for accessing memory cells can apply programming pulses having a variety of shapes and durations sufficient to cause the memory cells to threshold into the desired state. In other words, the present disclosure is not limited by a particular shape of the write and read voltages.

A method of reading memory cells involves applying a voltage pulse with a single polarity to the memory cell. For example, as mentioned above, FIG. 3 shows an example of a single-polarity read. In one such embodiment, access circuitry applies a voltage pulse with only a single particular polarity to the memory cells. Sense circuitry can detect the electrical response of a given memory cell to the single-polarity pulse. In the example illustrated in FIG. 3, reading the memory cell 300 involves applying a negative voltage pulse, such as negative read pulses 310 and 312. Although FIG. 3 illustrates negative read pulses 310, 312, access circuitry can also perform a single-polarity read using only positive voltage pulses to perform a single-polarity read.

If the read voltage pulse has a different polarity than the programming pulse, such as in the case of positive programming pulse 304 and negative read pulse 310, the memory cell exhibits a threshold voltage with a higher magnitude ($-V_{TH}$ High). In one such embodiment, if the read voltage pulse has the same polarity as the programming pulse, the memory cell exhibits a threshold voltage with a lower magnitude ($-V_{TH}$ Low). In the embodiment illustrated in FIG. 3, the polarity of the resulting threshold voltage is negative because the read voltage pulses are negative. Thus, when performing single polarity reads, the memory cell exhibits a threshold voltage with a higher magnitude (e.g., $|-V_{TH}$ High$|$) when the memory cell is in one logic state, and a threshold voltage with a lower magnitude ($|-V_{TH}$ Low$|$) when the memory cell is in another logic state. Access circuitry can thus determine the logic state of a given cell based on whether the memory cell exhibits a higher or lower magnitude threshold voltage.

Figure 4:
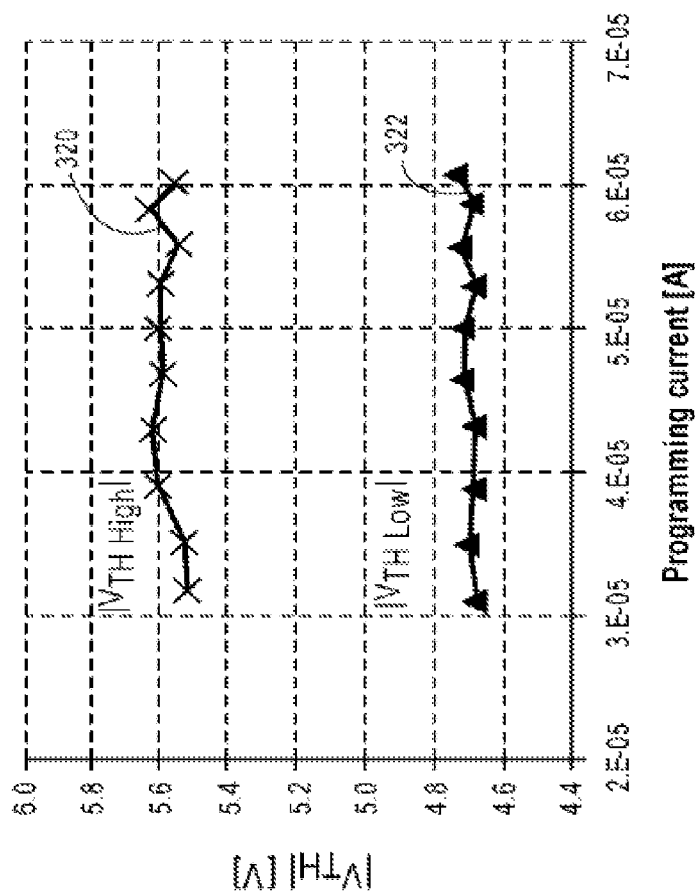
FIG. 4 is a graph of experimental data showing lower and higher threshold voltages exhibited by an exemplary memory cell.

FIG. 4 is a graph showing exemplary threshold voltages with a higher and lower magnitude. The graph includes experimental data (threshold voltages) collected from memory cells in response to application of different programming currents. Thus, the x-axis of the graph is the magnitude (absolute value) of the programming current and the y-axis of the graph is the magnitude (absolute value) of the resulting threshold voltage in response to the programming current. As mentioned above, depending upon the programming and read polarities, the threshold voltage magnitude exhibited by a memory cell will be higher (e.g., $V_{TH}$ High) or lower (e.g., $V_{TH}$ Low). The graph of FIG. 4 shows that the memory cells exhibit the higher and lower threshold voltages for a range of programming currents. This graph also shows that the higher and lower threshold voltages are actually ranges of voltages. For example, the higher threshold voltage magnitudes 320 are a range of magnitudes clustered at approximately 5.6V in the illustrated example. Similarly, the lower threshold voltage magnitudes 322 are a lower range of magnitudes approximately centered around 4.7V in the illustrated example. In this example. the ranges of lower and higher threshold voltage magnitudes are separated by a window.

The window between the ranges of threshold voltage magnitudes can affect the ability to reliably write to and read the memory cells. If the window between the threshold voltage ranges is sufficiently large (e.g., if the ranges of threshold voltages are sufficiently spaced apart), then access circuitry may be able to reliably distinguish between a logic 1 and 0 in response to a single-polarity read. For example, if the threshold voltage ranges are sufficiently spaced apart, access circuitry may be able to accurately read the memory cell by applying a single read voltage approximately at a mid-point between the low and high threshold voltages (e.g., about 5.1V as in FIG. 4). In one such example, applying a single read voltage at the mid-point between the low and high threshold voltages would cause memory cells programmed with the negative programming pulse 306 to threshold, but not the memory cells programmed with the positive programming pulse 304. Accordingly, access circuitry could distinguish the logic state of the memory cells by determining which memory cells thresholded in response to the single read voltage. However, if the window between the threshold voltage ranges is small, or if the threshold voltage ranges overlap, it can be difficult to reliably distinguish between a logic 1 or 0 with a single-polarity read.

The following is a detailed description of further important properties of the cell distributions, with particular reference to FIGS. 5A-5B and FIGS. 6A-6B.

Figures 5A, 5B:
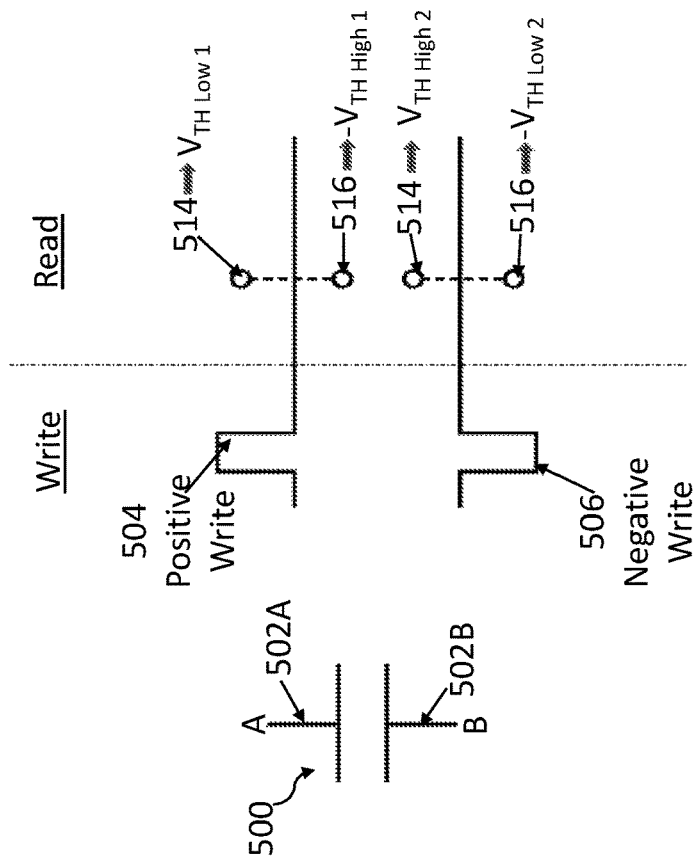
FIG. 5A schematically illustrates a read operation of cells with different polarity.
FIG. 5B is a table representing the effect of the read of FIG. 5A.

FIGS. 5A and 5B illustrate the effect of single-polarity reads with different polarities. FIG. 5A is a scheme illustrating a single-polarity read with either a positive or negative voltage. Similar to FIG. 3, FIG. 5A shows a memory cell 500 with two terminals 502A, 502B. Also similar to FIG. 3, FIG. 5A illustrates a positive programming pulse 504 and a negative programming pulse 506. FIG. 5A differs from FIG. 3 in that it shows the effects of positive and negative reads following positive and negative programming pulses. Specifically, FIG. 5A shows positive read pulses 514 and negative read pulses 516. Note that although the read pulses 514, 516 are illustrated without a specific pulse shape, the pulses can be any suitable pulse shape, such as the pulse shapes discussed above with respect to FIG. 3, and the present disclosure is not limited by the trend of the applied read voltage. Also note that FIG. 3 and the following description are regarding a single-polarity pulse (either positive read pulses or negative read pulses, but not both positive and negative pulses for a given read).

When the applied voltage and the programming voltage have the same polarity, the magnitude of the threshold voltage is low. For example, in the embodiment illustrated in FIG. 5A, the positive programming pulse 504 followed by the positive read pulse 514 results in $V_{TH}$ Low1. Similarly, the negative programming pulse 506 followed by the negative read pulse 516 results in $-V_{TH}$ Low2. When the applied voltage and the programming voltage have different polarities, the magnitude of the threshold voltage is high. For example, in the embodiment illustrated in FIG. 5A, the positive programming pulse 504 followed by the negative read pulse 516 results in $-V_{TH}$ High1. The negative programming pulse 506 followed by positive read pulse 514 results in $V_{TH}$ High2.

The magnitudes of higher and lower threshold voltages can vary. For example, in the example illustrated in FIG. 5A, $V_{TH}$ High1 can be different than $V_{TH}$ High2. For example, memory cells exhibit different high threshold voltage magnitudes that differ based on the polarity of the programming and read pulses. Specifically, the higher threshold voltage magnitude exhibited by a given memory cell when read with a negative voltage (e.g., the negative read pulse 516) is not necessarily the same as a higher threshold voltage magnitude exhibited by the cell when read with a positive voltage (e.g., the positive read pulse 514). Similarly, memory cells can exhibit different lower threshold voltage magnitudes that differ based on the polarity of the programming and read pulses. Specifically, the lower threshold voltage magnitude exhibited by a given memory cell when read with a positive voltage (e.g., the positive read pulse 514) is not necessarily the same as a lower threshold voltage magnitude exhibited by the cell when read with a negative voltage (e.g., the negative read pulse 516).

In another example, the high threshold voltage magnitudes are substantially the same regardless of the polarity of the programming and read pulses. Similarly, the low threshold voltage magnitudes can be substantially the same regardless of the polarity of the programming and read pulses. As is discussed below, high and low threshold voltage magnitudes can also vary from memory cell to memory cell when read with the same polarity. For example, memory cells located at different locations on a wafer can have different low and high threshold voltages. Thus, variations can exist in the magnitude of higher or lower threshold voltages due to, for example, read polarity and memory cell variations. Regardless of variations in high and low threshold voltages (e.g., due to programming/read polarity or memory cell variations), a given memory cell may exhibits a high threshold voltage and a low threshold voltage, where the magnitude of the high threshold voltage is greater than the magnitude of the low threshold voltage.

FIG. 5B is a table illustrating outcomes of the single polarity reads illustrated in FIG. 5A. The table of FIG. 5B shows how, in accordance with the embodiment illustrated in FIG. 5A, the read output from a memory cell is a function of the read and write polarities. The column on the left is the programming polarity applied to the terminals 502A, 502B of the memory cell 500. In the table of FIG. 5B, $V_A$ refers to the voltage applied to terminal A (502A) and $V_B$ refers to the voltage applied to terminal B (502B). Thus, it is shown a case in which the programming polarity relative to terminal 502A is positive ($V_A > V_B$), and a case in which the programming polarity relative to terminal 502A is negative ($V_B > V_A$).

The middle Column shows the threshold voltage when the polarity of the read voltage pulse is positive, and the right column shows the threshold voltage when the polarity of the read voltage pulse is negative. As explained above, when the polarity of the programming and read pulses is the same, the magnitude of the output voltage is low (e.g., |$V_{TH}$ Low1| or |$-V_{TH}$ Low2|). When the polarity of the programming and read pulses is different, the magnitude of the output voltage is high (e.g., |$-V_{TH}$ High1| or |$V_{TH}$ High2|). For example, when the higher threshold voltage has a magnitude of 5.7V and the lower threshold voltage has a magnitude of 4.7V, a positive programming pulse followed by a positive read pulse results in a threshold voltage of 4.7V. A positive programming pulse followed by a negative read pulse results in −5.7V. A negative programming pulse followed by a positive read pulse results in a threshold voltage of 5.7V. A negative programming pulse followed by a negative read pulse results in a threshold voltage of −4.7V. Thus, the magnitude and the sign of the output of a read depends upon the polarity of the programming voltage and the polarity of the read voltage, in accordance with an embodiment.

FIGS. 6A and 6B include graphs that show the ranges of threshold voltage magnitudes as distributions. The graph of FIG. 6A illustrates the distribution of threshold voltage magnitudes in response to a positive polarity read. The graph of FIG. 6B illustrates the distribution of threshold voltage magnitudes in response to a negative polarity read. In the embodiment illustrated in FIGS. 6A and 6B, the distributions of threshold voltage magnitudes (|$V_{TH}$|) are normal (e.g., Gaussian). As mentioned above, for illustrative purposes, FIGS. 6A and 6B adopts a particular programming convention that assumes access circuitry applies a positive programming pulse to program a cell to a logic 1, and a negative programming pulse to program the cell to a logic 0. However, another embodiment can adopt the opposite programming convention (e.g., a positive programming pulse can result in a logic 0 and a negative programming pulse can result in a logic 1).

Referring to the graph of FIG. 6A, the line 638 shows a distribution of threshold voltage magnitudes exhibited by memory cells programmed with a logic 1 when read with a positive voltage pulse. Thus, under the programming convention illustrated in FIGS. 6A and 6B, the line 638 shows a distribution of threshold voltage magnitudes exhibited by a memory cell that is programmed and read with voltage pulses having the same polarity. The line 638 therefore illustrates a distribution of lower threshold voltage magnitudes. The line 640 shows a distribution of threshold voltage magnitudes exhibited by memory cells programmed with a logic 0 and read with a positive voltage pulse. Thus, under the programming convention illustrated in FIGS. 6A and 6B, the line 640 shows a distribution of threshold voltage magnitudes exhibited by a memory cell that is programmed and read with voltage pulses having different polarities (e.g., programmed with a negative voltage pulse and read with a positive voltage pulse). The line 640 therefore illustrates a distribution of higher threshold voltage magnitudes.

Referring to the graph of FIG. 6B, the line 634 shows a distribution of threshold voltages exhibited by memory cells programmed with a logic 0 when read with a negative voltage pulse, in accordance with an embodiment. Thus, under the programming convention illustrated in FIGS. 6A and 6B, the line 634 shows a distribution of threshold voltages exhibited by a memory cell that is programmed and read with voltage pulses having the same polarity. The line 634 therefore illustrates a distribution of lower threshold voltages. The line 632 shows a distribution of threshold voltages exhibited by memory cells programmed with a logic 1 when read with a negative voltage pulse. Thus, under the programming convention illustrated in in FIGS. 6A and 6B, the line 632 shows a distribution of threshold voltage magnitudes exhibited by a memory cell that is programmed and read with voltage pulses having different polarities (e.g., programmed with a positive voltage pulse and read with a negative voltage pulse). The line 632 therefore illustrates a distribution of higher threshold voltage magnitudes.

As mentioned above, the distributions of higher and lower threshold voltages are separated by a window. For example, graph of FIG. 6A shows that at the 50th percentile the distribution 638 and the distribution 640 are separated by a window 642. Similarly, graph of FIG. 6B shows that at the $50^{th}$ percentile the distribution 634 and the distribution 632 are separated by a window 636. In embodiments, the windows 642 and 636 can be the same or different depending on the relative distributions. The graphs of FIGS. 6A and 6B also show that the distributions of lower threshold voltage magnitudes and higher threshold voltage magnitudes can overlap, especially at the tails of the distributions. For example, the graph of FIG. 6A shows a range of threshold voltage magnitudes in which the distributions 638 and 640 overlap. Similarly, the graph of FIG. 6B shows a range of threshold voltage magnitudes in which the distributions 632 and 634 overlap. The overlaps can occur due to, for example, local variations of material composition or dimensions of the individual memory cells. Therefore, when performing a single-polarity read, access circuitry that attempts to read a memory cell that falls within the distribution overlap can mistakenly read a cell that is a logic 1 as a logic 0, or vice versa. In some cases, error correction mechanisms can detect or correct such errors. However, if the distribution overlap is significant, then it may be impractical to rely on error correction mechanisms to handle the errors.

The above description has shown important properties of the cell distributions. In particular, the ranges of threshold voltages may thus overlap in particular regions, particularly at the tails of the distributions. As mentioned before, ideally, all memory cells should feature a same (nominal) resistivity (and therefore a same threshold voltage, for a same logic state. However, since different cells programmed to a same logic state exhibit different resistivity values because of several factors each logic state is actually associated to a respective resistivity distribution (typically a Gaussian-type distribution), and therefore to a respective threshold voltage distribution or range.

In order to assess the logic state of a Self-Selecting Memory (SSM) cell (e.g., a memory cells comprising a self-selecting memory material, such as a chalcogenide material, the self-selecting material acting both as selection element and as a storage element), a reading operation is carried out directed to assess to which threshold voltage distribution the threshold voltage of the SSM cell belongs. For example, a reading voltage may be applied to the SSM cell and the logic state of the SSM cell is assessed based on (the presence or absence of) a current responsive to said reading voltage, the (presence or absence of the) current depending on the threshold voltage of the SSM cell. It should be understood that a cell thresholds (e.g., it becomes conductive) when a voltage difference is applied between its two terminals.

According to the present disclosure, an advantageous read sequence enables correctly reading values stored in memory cells even when the threshold voltage distributions overlap. In this way, the embodiments disclosed allow to enlarge the sensing window (i.e., the difference between the voltage resulting from a logic "1" and a logic "0") for a read operation, providing for a more accurate determination of the logic state of the memory cell and thus reducing error rates.

As mentioned above, when the applied voltage and the programming voltage have same polarity, the magnitude of the threshold voltage is low. For example, according to an embodiment of the present disclosure illustrated in FIG. 7, positive programming pulse 704 (corresponding to a logic state "1") results in $V_{TH}$ Low 1, for example as described with reference to FIGS. 5A and 5B. In at least some cases, the logic state "1" may be determined by applying a positive read pulse 714, e.g., whenever the memory cell thresholds when biased with positive read pulse 714, resulting in said $V_{TH}$ Low 1. When the applied voltage and the programming voltage have different polarities, the magnitude of the threshold voltage is high. For example, negative programming pulse 706 (corresponding to logic state "0") results in $V_{TH}$ High 1, when read in positive polarity. Therefore, cells in logic state "0" do not threshold when biased with positive read pulse 714. Due to distribution overlap (e.g., see FIG. 6A), some cells in logic state "1" do not threshold when biased with positive read pulse 714 and are therefore undistinguishable from cells in logic state "0". Again, the shape of the read voltage may vary according to the needs or circumstances (e.g. it may me a ramp, a squared pulse, and the like).

Figure 7:
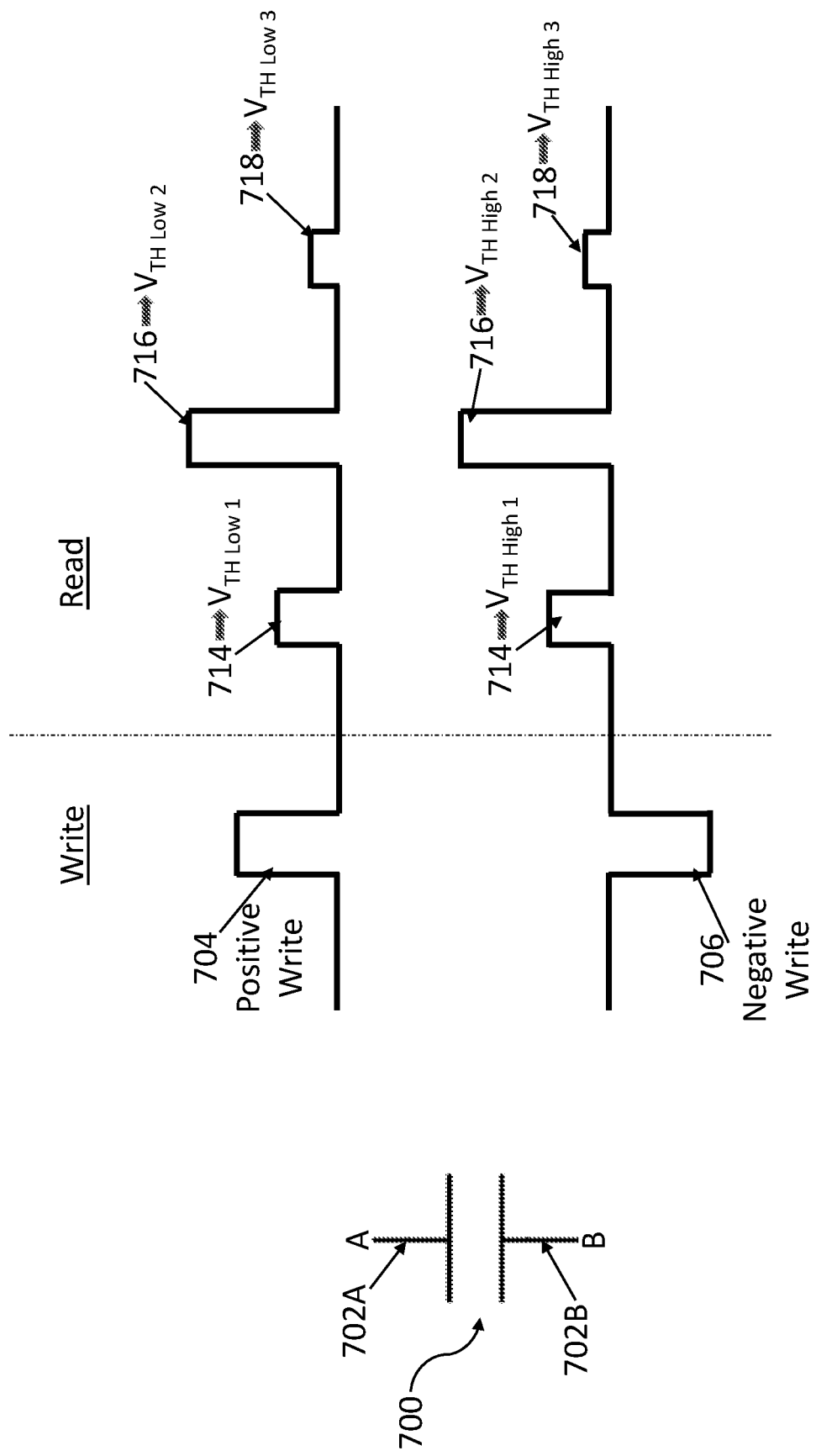
FIG. 7 schematically illustrates a read sequence of a memory cell according to an embodiment of the present disclosure.

According to the embodiment of FIG. 7, the magnitude of a first read pulse applied to a plurality of cells, such as the first read pulse 714 applied to the cell 700, is lower than the magnitude of a second read pulse 716, having the same polarity of the first read pulse 714. In other words, FIG. 7 is similar to FIG. 5A except that FIG. 7 shows a read sequence in which the first applied voltage 714 in the read sequence is positive and followed by a second positive read voltage 716. As disclosed in greater detail below, a third pulse 718, having the same polarity of the first and second read pulses, is subsequently applied. Even if the present disclosure refers to an embodiment wherein three consecutive positive read pulses are applied on cells programmed with positive and/or negative read pulses, three consecutive negative read pulses can be used. Moreover, memory cells programmed with positive programming pulse 704 followed by positive read pulse 716 results in $V_{TH}$ Low 2, and memory cells programmed with positive programming pulse 704 followed by positive read pulse 718 results in $V_{TH}$ Low 3. Likewise, memory cells programmed with negative programming pulse 706 followed by positive read pulse 716 results in $V_{TH}$ High 2, and memory cells programmed with negative programming pulse 706 followed by positive read pulse 718 results in $V_{TH}$ High 3. The proportion between the read pulses depicted in FIG. 7 is only for illustrative purpose and nonlimiting example.

As discussed below, access circuitry can determine the logic state of memory cells based on the electrical responses of the memory cells to the application of a read voltage. According to the present disclosure, applying the a first read pulse with a suitable magnitude, such as the pulse 714 of FIG. 7, enables access circuitry to determine whether the programming voltage was positive (e.g., corresponding to a logic "1" state), or inconclusive. In one such embodiment, if access circuitry determines the programming polarity is inconclusive based on the first read pulse, access circuitry can apply subsequent read pulses to resolve the inconclusiveness. In this way, applying subsequent read pulses with a suitable magnitude enables access circuitry to discriminate between memory cells that were programmed with a positive voltage (e.g., corresponding to a logic "1" state) and a negative voltage (e.g., corresponding to a logic "0" state), as discussed in greater detail in relation to FIGS. 8A-8F.

For example, sense circuitry detects an electrical response of the plurality of memory cells to the applied voltage. Sense circuitry may detect one of a voltage drop (e.g., a threshold voltage) across terminals of a given memory cell of the array, current through the given memory cell, and a threshold event of the given memory cell. In one embodiment, detecting a threshold voltage for a memory cell can include determining that the cell's threshold voltage is lower than or higher than a reference voltage. Based on the electrical response, access circuitry can determine the logic state of the memory cells or determine that the state is inconclusive. In one embodiment in which the sense circuitry is to detect current through a given memory cell, the access circuitry is to determine the given memory cell is in a logic state based on detection that the current is greater or lower to a threshold current (i.e. based on the presence or absence of said current) in response to the applied voltage, said response depending on the threshold voltage of the cell. In one embodiment, a threshold event switches the cell (e.g., the non-phase change chalcogenide self-selecting memory material) from a high resistivity to a low resistivity state, resulting in a current that is greater than or equal to a threshold current. In one embodiment, the threshold current is in the range of 1-10 pA (microamperes). However, other embodiments may have a threshold current that is lower than 1 µA or higher than 10 µA depending on, for example, the storage material's properties (e.g., conductivity of the storage material).

FIGS. 8A-8F and the corresponding descriptions illustrate how access circuitry can read memory cells using a read sequence such as the sequence shown in FIG. 7, in accordance with an embodiment of the present disclosure. More in particular, FIGS. 8A-8F are graphs illustrating distributions of threshold voltages exhibited by memory cells during performance of a read in accordance with an embodiment of the present disclosure.

Referring to FIG. 8A, the graph illustrates distributions 801, 803 of threshold voltages exhibited by memory cells programmed with logic 1 and logic 0 respectively. In the embodiment illustrated in FIG. 8A, the distribution 801 is for memory cells programmed and read with a positive polarity. The distribution 803 is for memory cells programmed with a negative polarity and read with a positive polarity. Thus, points 802 and 804 are threshold voltages for two different memory cells programmed to logic 1 with a positive voltage and read with a positive voltage. Points 806 and 808 are threshold voltages for two other memory cells programmed to logic 0 with a negative voltage and read with a positive voltage.

FIG. 8B illustrates application of a first read voltage ($V_{DM1}$, which can correspond to the voltage of pulse 714 of FIG. 7) in a read sequence. In the illustrated embodiment, in accordance with the read sequence of the present disclosure, the first read voltage $V_{DM1}$ has a positive polarity, and is thus "coherent" with the memory cells programmed to logic 1 with a positive voltage. The magnitude of the first read voltage $V_{DM1}$ is selected to be lower than an expected lowest threshold voltage magnitude of cells programmed to the "0" logic state, e.g., lower than the lowest threshold voltage of cells in distribution 803. The memory cells exhibit electrical responses to the first voltage, i.e. the memory cells can either threshold or not threshold in response to $V_{DM1}$. Whether or not a given memory cell thresholds in response to $V_{DM1}$ depends on whether the memory cell is programmed to a logic 1 or logic 0, and whether or not the memory cell exhibits threshold voltages in the range of overlap between the distributions. According to the present disclosure, a memory cell thresholds in response to an applied voltage if the applied voltage has a magnitude that is greater than the threshold voltage thereof. Specifically, in reference to the FIG. 8B, the plurality of memory cells can be grouped based on their response to the first voltage, including: memory cells that are programmed with a logic 1 that threshold in response to the first voltage (e.g., the group of memory cells including the cell corresponding to data point 802); memory cells that are programmed with a logic 0 that do not threshold in response to the first voltage (e.g., all the distribution 803, including points 806 and 808); and memory cells that are programmed with a logic 1, but that do not threshold in response to the first voltage (e.g., the group of memory cells including the cell corresponding to point 804, i.e. cells that exhibit a threshold voltage that falls within the overlap of distributions).

In one such embodiment, $V_{DM1}$ has a polarity and magnitude to correctly identify the logic 1 memory cells that threshold in response to the $V_{DM1}$. For example, the magnitude of $V_{DM1}$ is high enough to cause the memory cell corresponding to point 802 to threshold, and thus enable access circuitry to correctly read a logic 1. As illustrated, $V_{DM1}$ is high enough to cause memory cells falling in the range 810 of the distribution (e.g., the lower part of the distribution 801) to threshold, and thus enable access circuitry to read those memory cells as a logic 1.

In addition to correctly ascertaining that all the memory cells in the range 810 are logic 1, application of $V_{DM1}$ also refreshes or reinforces the data stored in the memory cells that threshold. In one such embodiment, the memory cells in the range 810 get reinforced in response to the first voltage because those memory cells experience a threshold event, and therefore the application of the first voltage has a programming effect. In one such example, the read polarity is coherent with program polarity of cells that threshold, so the read pulse and corresponding threshold event has the same effect as a write pulse that programs the same logic state already stored in the memory cell. Thus, in one embodiment, application of the $V_{DM1}$ is also able to refresh the memory cells that threshold in response to the first voltage, which can prevent drift of the thresholding memory cells' state.

Memory cells that do not threshold in response to the first voltage $V_{DM1}$ could be either memory cells programmed to logic 0, or memory cells programmed to a logic 1 that exhibit a threshold voltage with a magnitude higher than $V_{DM1}$ (e.g., memory cells that exhibit a threshold voltage magnitude that falls within the overlap of distributions, in the high tail of the distribution 801, including point 804). In the illustrated example, $V_{DM1}$ has a magnitude that is lower than the magnitudes of all the threshold voltages of distribution 803 (e.g., a magnitude that is lower than an expected lowest magnitude of the range defined by line 803). Therefore, in the illustrated embodiment, the memory cells programmed to logic 0 (including the memory cells corresponding to the data points 806 and 808) do not threshold in response to $V_{DM1}$. Therefore, in a system performing a single read, the memory cell corresponding to point 804 would likely be read incorrectly as a logic 0. In accordance with an embodiment of the present disclosure, access circuitry determines that the logic state of the non-thresholding memory cells is inconclusive in response to $V_{DM1}$ alone. Then, advantageously according to the present disclosure, access circuitry determines the logic state of such memory cells based on a read sequence, i.e. based on the memory cell responses to $V_{DM1}$ and to subsequent applied voltages having the same polarity, as discussed further below.

FIG. 8C shows the outcome of $V_{DM1}$, i.e. of the first read voltage, in the read sequence according to the present disclosure (data points of cells in range 830 that have thresholded are purposely hidden because their logic state has been unambiguously determined as "1"). After applying $V_{DM1}$, access circuitry is able to determine whether a given memory cell of the array is in the first logic state (e.g., logic 1 in the illustrated example) or whether the given memory cell's logic state is inconclusive based on the electrical responses to $V_{DM1}$. Thus, access circuitry determines that the memory cells that threshold in response to $V_{DM1}$ (e.g., memory cells in the range 830, corresponding to range 810 of FIG. 8B) are logic 1. The access circuitry also determines that memory cells that do not threshold in response to $V_{DM1}$ (e.g., memory cells in the range 832) could be either a logic 1 or logic 0, and thus have a logic state that is inconclusive.

In one embodiment, the access circuitry is further configured to apply subsequent read voltages to discriminate between the memory cells that are actually logic 0, and those that are logic 1 (e.g., logic 1 cells in the high tail of the distribution 801).

According to the present disclosure, a second read voltage having the same polarity and a different magnitude than $V_{DM1}$ is applied. FIG. 8D illustrates the distributions of threshold voltages in response to the second read voltage, indicated as $V_{DM2}$. As discussed above, if a memory cell is programmed and read with the same polarity, it exhibits a threshold voltage having a magnitude in the lower distribution. Thus, the memory cells programmed to logic 1 with a positive voltage and then read with positive voltage exhibit a threshold voltage having a magnitude falling in the lower range. The memory cells programmed to logic 0 with a negative voltage and then read with a positive voltage exhibit a threshold voltage having a magnitude in the higher range.

As discussed above, access circuitry is able to determine that the memory cells in the range 810 are a logic 1 in response to the first read voltage. Therefore, because the access circuitry already determined the logic state of such memory cells in the range 810, the access circuitry can mask (e.g., screen) those memory cells from the second read voltage. If access circuitry masks the memory cell from a voltage, the access circuitry does not apply such voltage to that memory cell, as shown in FIGS. 8C and 8D. In an embodiment, masking a cell correspond to switch off (i.e. ground) the corresponding digit line. Accordingly, memory cells that have been determined to be in logic state 1 may be masked in subsequent steps, in some examples.

FIG. 8D thus illustrates application of the second read voltage $V_{DM2}$ in the read sequence of the present disclosure. In the illustrated embodiment, in accordance with the sequence of FIG. 7, also the second voltage has a positive polarity, and is thus "coherent" with the memory cells programmed to logic 1 with a positive voltage. The magnitude of $V_{DM2}$ is selected to be higher than an expected highest threshold voltage magnitude of cells programmed to the "1" logic state, e.g., higher than the highest threshold voltage of cells in distribution 801. As before, the memory cells exhibit electrical responses to the second voltage, i.e. the memory cells can either threshold or not threshold in response to $V_{DM2}$. Whether or not a given memory cell thresholds in response to $V_{DM2}$ depends on whether the memory cell is programmed to a logic 1 or logic 0, and whether or not the memory cell exhibits threshold voltages in the range of overlap between the distributions (e.g., comprised between $V_{DM1}$ and $V_{DM2}$). It should be understood that possible cells that have been masked in previous steps are not interested in this operation; e.g., detecting second threshold voltages exhibited by the plurality of memory cells in response to application of the second read voltage should be intended as detecting the second threshold voltage of unmasked memory cells. A memory cell thresholds in response to an applied voltage if the applied voltage has a magnitude that is greater than the exhibited threshold voltage. Specifically, in reference to the FIG. 8D, the plurality of memory cells can be grouped based on their response to the second voltage, including: memory cells that are programmed with a logic 1 that threshold in response to the second voltage (e.g., the group of memory cells including cell corresponding to data point 804, i.e. cells that exhibit a threshold voltage that falls within the overlap of distributions); memory cells that are programmed with a logic 0 that threshold in response to the second voltage (e.g., the group of memory cells including the cell corresponding to the point 808); and memory cells that are programmed with a logic 0 that do not threshold in response to the second voltage (e.g., the memory cells including cell corresponding to the point 806, in the high part of distribution 803).

In one such embodiment, $V_{DM2}$ has therefore a polarity and magnitude to correctly identify logic 0 memory cells that do not threshold in response to said $V_{DM2}$. The magnitude of $V_{DM2}$ is high enough to cause all the memory cells programmed with logic 1 (i.e. the group of cells including point 804) to threshold, as well as to cause the group of cells including point 808 to threshold, but low enough to cause some memory cells (e.g. the group of cells including point 806 in FIG. 8D, falling in the range 820) programmed with logic 0 to not threshold and thus enable access circuitry to correctly read a logic 0 for these latter cells. In other words, the second read voltage $V_{DM2}$ is low enough to cause memory cells falling in the range 820 of the distribution (e.g., the higher part of the distribution 803) not to threshold, and thus enable access circuitry to read those memory cells as a logic 0.

Therefore, memory cells that threshold in response to the second read voltage $V_{DM2}$ could be either memory cells programmed to logic 1, or memory cells programmed to a logic 0 that exhibit a threshold voltage with a magnitude lower than $V_{DM2}$ (e.g., memory cells that exhibit a threshold voltage magnitude that falls within the overlap of distributions). In the illustrated example, $V_{DM2}$ has a magnitude that is higher than the magnitudes of all the threshold voltages of distribution 801 (e.g., a magnitude that is higher than an expected highest magnitude of the range defined by line 801), in such a way that all the memory cells programmed to logic 1 threshold in response to $V_{DM2}$. At the same time, a memory cell that is programmed to logic 0, but that exhibits a threshold voltage that is on the low tail of the distribution 803 (e.g., the group of cells including the cell corresponding to point 808) may threshold in response to $V_{DM2}$. According to the present disclosure, access circuitry determines that the logic state of such thresholding memory cells is inconclusive in response to $V_{DM2}$.

As shown in FIG. 8D, after applying $V_{DM2}$, access circuitry is thus able to determine whether a given memory cell of the array is in the second logic state (e.g., logic 0 as memory cells 820 in the illustrated example) or whether the given memory cell's logic state is inconclusive based on the electrical responses to $V_{DM2}$ (i.e. cells that could be either a logic 1 or logic 0).

Because the access circuitry already determined the logic state of the memory cells in the range 820, the access circuitry can mask (e.g., screen) those memory cells from a subsequent read voltage. If access circuitry masks the memory cell from a voltage, the access circuitry does not apply a subsequent voltage to that memory cell, as shown in FIGS. 8E and 8F. In an embodiment, masking a cell correspond to switch off (i.e. ground) the corresponding digit line.

Accordingly, memory cells that have been determined to be in logic state 1 may be masked in subsequent steps, in some examples.

As shown in FIG. 8E, in addition to correctly ascertaining that all the memory cells in the range 820 are logic 0, application of $V_{DM2}$ also causes the cells initially programmed with logic 0 and having a threshold voltage with magnitude lower than $V_{DM2}$ (i.e. the cells in the range of overlap, including point 808) to switch logic state, i.e. to be reprogrammed with the opposite logic state 1. In this way, such cells reprogrammed with an opposite logic state (i.e. with the logic state 1 in the illustrated example) have a threshold voltage that is now lower than the lowest threshold voltage of the distribution 803 (i.e. of all the cells initially programmed with logic 0), and also lower than that of the group of cells programmed with logic 1 and being in the range of overlap, i.e. the group cells including point 804.

In other words, some memory cells threshold in response to the application of $V_{DM2}$ and change logic state (e.g. the group of cells including point 808). In fact, because the polarity of the second read voltage $V_{DM2}$ is different than the polarity used to program the group of memory cells including point 808, the application of $V_{DM2}$ causes those memory cells to change from a logic 0 to a logic 1. Accordingly, the access circuitry reprograms those memory cells after the application of $V_{DM2}$. Therefore, after being reprogrammed, when read with positive read voltage, the switched cells exhibit lower threshold voltages, in particular analogous to those of the lower tail of the original distribution 801, and thus well separated from the highest part of such distribution 801 (i.e. well separated from the group of cells including point 804, as shown in FIG. 8E).

According to the present disclosure, the access circuitry is then configured to apply a subsequent third read voltage $V_{DM3}$ to discriminate between the memory cells that actually were programmed to logic 0, and those that were programmed to logic 1, as illustrated in FIG. 8F.

The third read voltage $V_{DM3}$ has the same polarity and a different magnitude than the first read voltage $V_{DM1}$ and the second read voltage $V_{DM2}$. FIG. 8F illustrates the distributions of threshold voltages in response to said third read voltage. As discussed above, if a memory cell is programmed and read with the same polarity, it exhibits a threshold voltage having a magnitude in the lower distribution. Thus, the memory cells that have been reprogrammed to logic 1 after the application of the second read voltage $V_{DM2}$ (e.g., memory cell initially programmed with negative programming pulse to in the low range of the logic 0 distribution, such as cell 808), and then read with the third positive voltage $V_{DM3}$, exhibit a threshold voltage having a magnitude falling in the lower range. More in particular, since such reprogrammed cells initially belonged to the lowest part (i.e. the tail) of the distribution 803 initially programmed with a logic 0, the magnitudes of the threshold voltages of these switched cells are now lower than the lowest expected voltage of the remaining, not screened, group of cells initially programmed with logic 1, (i.e. the group of cells in the range of overlap, including point 804, which is on the tail of the distribution 801). For this reason, the switched cells do not belong to the region of overlap of the distributions anymore and can be easily read with the third read voltage. It is in fact observed that the region of overlap is generally at the tails of the cells distribution, so that the application of first and second voltages with a suitable magnitude, and the subsequent masking of the cells whose logic state has been determined, allows reading well-separated distributions for the remaining cells whose state has to be determined. It should be understood that possible cells that have been masked in previous steps are not interested in this operation; e.g., detecting third threshold voltages exhibited by the plurality of memory cells in response to application of the third read voltage should be intended as detecting the third threshold voltage of unmasked memory cells.

The third read voltage has a magnitude that is higher than the highest expected magnitude of the threshold voltages of the switched cells (i.e. memory cells originally in the second logic state, or logic state 0, after they have been reprogrammed when applying the second read voltage $V_{DM2}$, such as the switched group including point 808) and lower than the lowest expected voltage of the remaining group of cells initially programmed with logic 1, (i.e. the group including point 804). In the illustrated embodiment, in accordance with the sequence of FIG. 7, also the third voltage has a positive polarity, and is thus "coherent" with the memory cells reprogrammed to logic 1 with a positive voltage. As before, the memory cells exhibit electrical responses to the third voltage, i.e. the memory cells can either threshold or not threshold in response to $V_{DM3}$. In this case, whether or not a given memory cell thresholds in response to $V_{DM3}$ depends on whether the memory cell has switched the logic state thereof during the application of the second read voltage $V_{DM2}$. Specifically, with reference to the FIG. 8F, the memory cells can be grouped based on their response to the third voltage, including: memory cells that have been reprogrammed with a logic 1 that threshold in response to the third voltage (i.e., the memory cells including the cell corresponding to data point 808) because such cells have now a threshold voltage whose magnitude is lower than that of $V_{DM3}$; and memory cells that are initially programmed with a logic 1 that do not threshold in response to the third voltage (e.g., the group of memory cells including point 804).

In one such embodiment, $V_{DM3}$ has a polarity and magnitude to correctly identify the cells that do threshold in response to said $V_{DM3}$, and to associate to said cell the proper logic state 0 (because such cells have been reprogrammed from logic 0 to logic 1 after the application of the second read voltage). The magnitude of $V_{DM3}$ is high enough to cause all the reprogrammed memory cells to threshold, but low enough to cause some memory cells (e.g. cells corresponding to point 804) initially programmed with logic 1 to not threshold and thus enable access circuitry to correctly read a logic 1 for these latter cells.

In other words, as shown in FIG. 8F, after applying $V_{DM3}$, access circuitry is able to determine whether a given memory cell of the array is in the first logic state (e.g., logic 1 in the illustrated example) or whether the given memory cell is in the second logic state (e.g., logic 0 in the illustrated example) based on the electrical responses to $V_{DM3}$. Therefore, memory cells that threshold in response to the third voltage $V_{DM3}$ are memory cells initially programmed to logic 0 and access circuitry determines that the logic state of such thresholding memory cells is 0 in response to $V_{DM3}$, while the state of the cell that do not threshold in response to $V_{DM3}$ is 1.

Therefore, according to the read sequence of the present disclosure, it is possible to read a plurality of cells with reduced error rates, because the read in the region of overlap is avoided and the window between cell distributions is enhanced thanks to the application of three subsequent pulses having the same polarity and suitably magnitudes.

All the above concepts can be applied also for a sequence of three negative read pulses, wherein the negative polarity read pulses results in negative threshold voltage. Moreover, as explained before, in this case, the distribution of threshold voltage magnitudes for logic 0 memory cells would be lower than the distribution of threshold voltage magnitudes for logic 1 memory cells; all the other concepts of the present disclosure thus apply mutatis mutandis.

Table of FIG. 9 is a chart illustrating the outcomes of the read sequence in accordance with the description of FIGS. 8A-8F. The chart includes four rows for memory cells programmed to logic 1 or logic 0, such rows corresponding to the portions in which the cells distributions are ideally subdivided by the read operation according to the present disclosure. A "1" in the first column on the left refers to a memory cell that is initially programmed to a logic 1 (e.g., with a positive programming voltage), and a "0" refers to a memory cell that is initially programmed to a logic 0 (e.g., with a negative programming voltage). The remaining columns of the table indicate whether or not the memory cell thresholds in response to the read voltages according to the present disclosure.

According to an embodiment of the present disclosure, the selection of the proper read voltage $V_{DMi}$ (i=1, 2 and 3) is obtained by defining said read voltage as the voltage that corresponds to a deterministic number of bit switched (i.e. read cells) during the application of read voltages. At this regard, a per-codeword counter configured to account for the number of cells that undergo a threshold event during reading may be used. In this case, in the reading operation, a voltage ramp is applied, in such a way that the bias voltage is increased from a starting read voltage (e.g., ground zero voltage) until the number of switched bits, as counted by the counter, reaches a predetermined value previously stored and corresponding to the proper magnitude of the read voltage.

For example, according to this embodiment, if the total number of cells programmed with logic 1 is J and the total number of cells programmed with logic 0 is K, then the first read voltage corresponds to a ramp applied for a certain time until the number of switched bit is equal to aJ, where a is a<1 and is selected according to the needs and circumstances (e.g. selected in such a way not to reach the region of overlap); this first portion of the ramp corresponds to the first read voltage. Then, the ramp is continued until the number of switched bits read is equal to J+bK, where b<1 and is selected according to the needs and circumstances; this second portion of the ramp thus corresponds to the second read voltage. Then, after a given time, a new ramp is applied and is increased from a starting read voltage (e.g., from zero voltage) until the number of switched bits read is equal to a preset value accounting for the cells that have reprogrammed to an opposite logic state. This new ramp corresponds to the third read voltage. In some embodiments, the first and the second reading voltages are applied independently of the switched bits count and only the third reading uses an increasing ramped voltage until the count of bits in a predefined state (including the bits determined to be in the predefined state during the first and/or the second reading) matches the number of bits in the codeword stored to be in that state.

In other words, according to this embodiment, the number of cells read is compared to a stored threshold value, so that the stop of the read ramp is performed based of the number of cells read, thanks to the counter.

In general, the third read voltage is applied after a given waiting time, said time being determined with a dedicated test and being configurable by design.

Figure 10A:
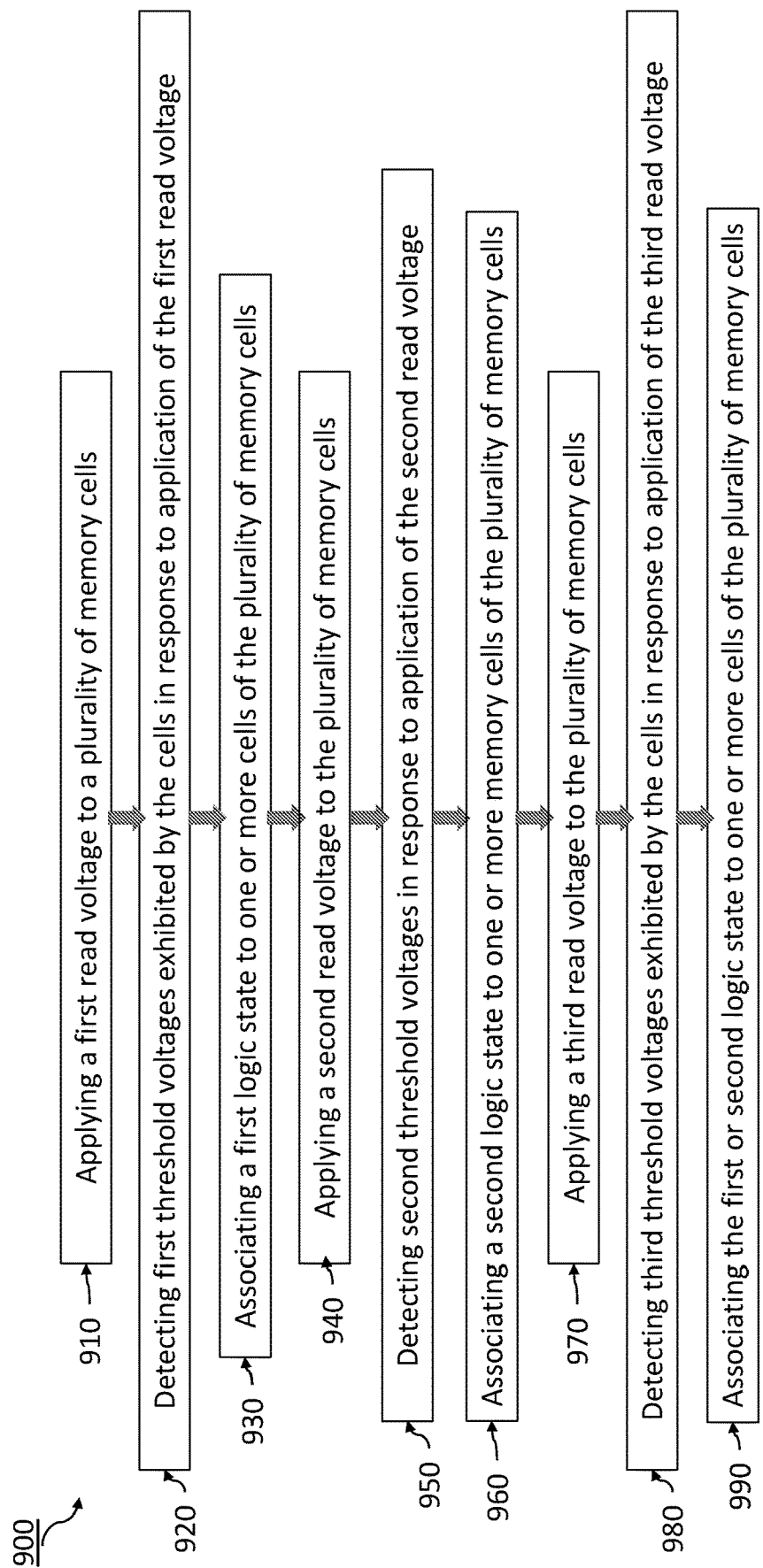
FIG. 10A is a flow diagram representing steps of a method according to the present disclosure.

FIG. 10A is flow chart representing steps of a method according to the present disclosure. The processes described can be performed by hardware logic and circuitry. For example, the following processes are described as being performed by access circuitry and sense circuitry, as disclosed herein. However, other embodiments can include different circuitry configurations suitable for performing the processes.

The method of the present disclosure is a method of performing a read sequence for reducing error rates in read operations of memory cells. Prior to reading the memory cells, access circuitry writes data to a plurality of memory cells. For example, access circuitry writes logic 0s and logic 1s to a plurality of memory cells such as the memory cell 100 of FIG. 1. In one embodiment, access circuitry can write logic 0s by applying programming pulses with a negative polarity and logic 1s by applying programming pulses with a positive polarity. The opposite convention can also be adopted. After writing data to the plurality of memory cells, access circuitry can read the plurality of memory cells using the read sequence of the present disclosure.

More in particular, at step 910, a first read voltage to a plurality of memory cells is applied. Then, at step 920, first threshold voltages exhibited by the cells in response to application of the first read voltage are detected. At step 930, a first logic state is then associated to one or more cells of the plurality of memory cells based on the first threshold voltages detected in the previous step. In some embodiments, the first read voltage has a first magnitude that is lower than an expected smallest threshold voltage magnitude of memory cells in the first logic state.

In contrast to conventional read techniques, the method of the present disclosure provides a further step 940 of applying a second read voltage to the plurality of memory cells, wherein the second read voltage has the same polarity of the first read voltage and a second magnitude that is higher than a first magnitude of the first read voltage. In some embodiments, the second magnitude is higher than an expected highest threshold voltage magnitude of memory cells in the first logic state. In some embodiments, the one or more memory cells to which the first logic state was associated to in step 930 are masked from the applying the second read voltage.

In a step 950, the method then provides detecting second threshold voltages exhibited by the plurality of memory cells in response to application of the second read voltage. Based on the second threshold voltages, a second logic state is then associated to one or more cells of the plurality of memory cells at step 960.

Step 970 then provides applying a third read voltage to the plurality of memory cells, wherein the third read voltage has the same polarity of the first and second read voltages and is applied at least to a group of memory cells that, during the application of the second read voltage, have been reprogrammed to an opposite logic state. In some embodiments, the one or more memory cells to which the second logic state was associated to in step 960 are masked from the applying the third read voltage. Step 980 provides detecting third threshold voltages exhibited by the plurality of memory cells in response to application of the third read voltage. Finally, based on the third threshold voltages, step 990 provides associating one of the first or second logic state to one or more of the cells of the of the plurality of memory cells. Method 900 may also include (not shown) reprogramming to an opposite logic state at least memory cells that underwent a threshold event when biased at $V_{DM2}$ (e.g., memory cells in the group of data point 808, for example). Circuitry 142, including access circuitry 143 and sense circuitry 145, may apply first, second and third voltages to memory cells, detect first, second and third threshold voltages and/or threshold events and associate first and second logic states to memory cells according to the method and as described with reference to FIGS. 7 and 8, in some embodiments.

Figure 10B:
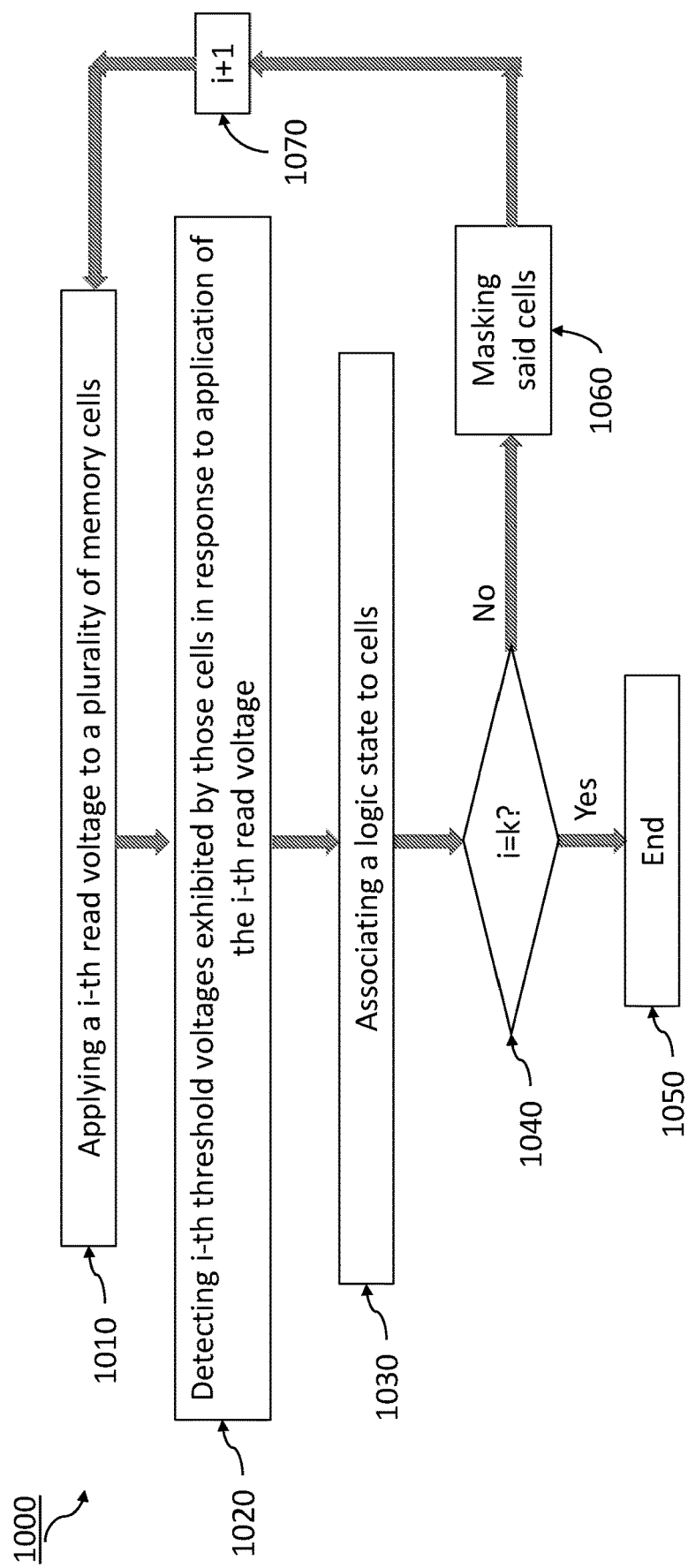
FIG. 10B is a flow diagram representing steps of a method according to an embodiment of the present disclosure.

FIG. 10B is a flow diagram representing steps of a method according to an embodiment of the present disclosure. At step 1010, a i-th read voltage is applied to a plurality of memory cells. For example a first read voltage $V_{DM1}$ is applied to the memory cells. At step 1020, i-th threshold voltages exhibited by those cells in response to application of the i-th read voltage are detected. For example, a threshold voltage lower than $V_{DM1}$ is detected for those cells exhibiting a threshold event when biased to $V_{DM1}$. At step 1030, a logic state is associated to cells. For example a logic state 1 is associated to cells with a threshold voltage lower than $V_{DM1}$ in step 1020. Other memory cells have an undetermined state at this stage. At step 1040 a verification is made whether the i-th read voltage has reached the last (k) read voltage. If it has (Yes), the method ends at step 1050; if it has not (No) the method continues at step 1060, with masking said cells from subsequent steps. At step 1070 the I counter is incremented and the method continues with applying the next (e.g., i+1) read voltage at step 1010. For example $V_{DM2}$ is applied to unmasked memory cells. The method may be carried out by circuitry 142, including access circuitry 143 and sense circuitry 145, that may apply first, second and third voltages to memory cells, detect first, second and third threshold voltages and/or threshold events and associate first and second logic states to memory cells according to the method and as described with reference to FIGS. 7 and 8, in some embodiments.

As shown in FIG. 10B, once a cell is determined to be in a logic state (0 or 1), said cell can be masked (or screened) from subsequent readings. According to the preferred embodiment of the present disclosure, at least three subsequent reading are performed to obtain a read operation with a greatly reduced number of steps, so that k may be equal to 3 in the flow chart of FIG. 10B. Method 1000 may also include (not shown) reprogramming to an opposite logic state at least memory cells that underwent a threshold event when biased at $V_{DM2}$ (e.g., memory cells in the group of data point 808, for example).

In other embodiments, the method 1000 comprises applying (1010) ramped read voltages, and the detecting threshold voltages (1020) comprises counting how many cells undergo a threshold event and stopping each ramp when the count matches a pre-determined number of cells in the given logic state (therefore adjusting the $V_{DM1}$, $V_{DM2}$ and/or $V_{DM3}$ values based on the respective counts). Association of logic states to cells (1030) occurs based on threshold voltage detection (1020) at each step.

Figure 11:
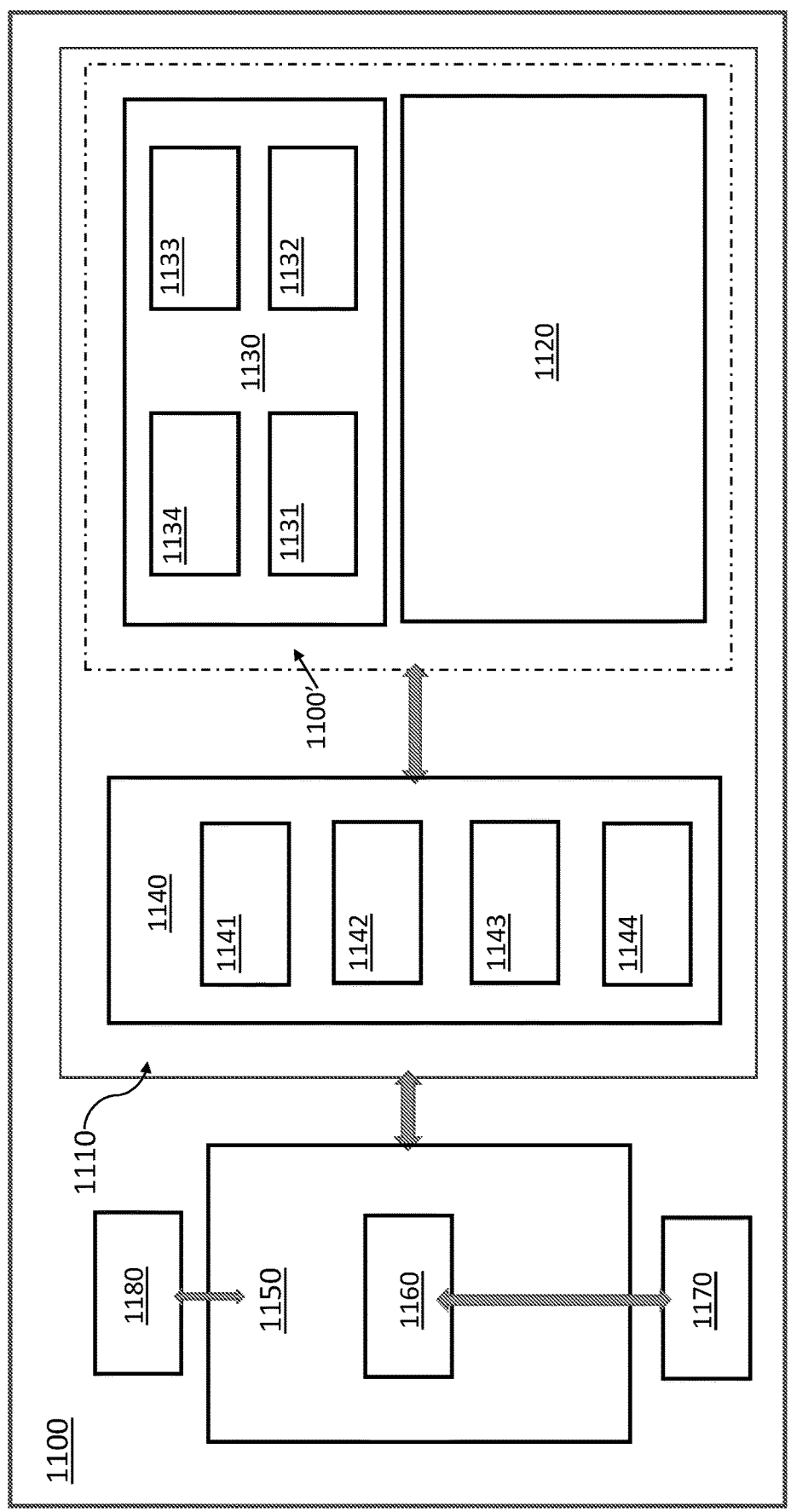
FIG. 11 shows a schematic block diagram of a system including a memory device according to the disclosure.

FIG. 11 is a high-level scheme of a system 1100 that can perform the read sequence of the present disclosure. The system 1100 includes a memory device 1110 in turn including an array of memory cells 1120 and a circuit portion 1130 operatively coupled to the memory cells 1120; the memory cells 1120 and the circuit portion 1130 form a memory portion, herein referred to as memory portion 1100'.

The memory device 1110 comprises a memory controller 1140, which represents control logic that generates memory access commands, for example in response to command by a host 1150. Memory controller 1140 accesses memory portion 1100'. In one embodiment, memory controller 1140 can also be implemented in the host 1160, in particular as part of a host processor 1160, even if the present disclosure is not limited by a particular architecture. The controller 1140 can include an embedded firmware and is adapted to manage and control the operation of the memory portion 1100'.

The memory device 1110 can also comprise other components, such as processor units coupled to the controller 1140, antennas, connection means (not shown) with the host device, and the like.

Multiple signal lines couple the memory controller 1140 with the memory portion 1100'. For example, such signal lines may include clock, command/address and write data (DQ), read DQ, and zero or more other signal lines. The memory controller 1140 is thus operatively coupled to the memory portion 1100' via suitable buses.

The memory portion 1100' represents the memory resource for the system 1100. In one embodiment, the array of memory cells 1120 is managed as rows of data, accessed via wordline (rows) and bitline (individual bits within a row) control. In one embodiment, the array 1120 of memory cells includes a 3D crosspoint array such as the memory cell array 200 of FIG. 2. The array 1120 of memory cells can be organized as separate channels, ranks, and banks of memory. Channels are independent control paths to storage locations within memory portion. Ranks refer to common locations across multiple memory devices (e.g., same row addresses within different devices). Banks refer to arrays of memory locations within a memory device. In one embodiment, banks of memory are divided into sub-banks with at least a portion of shared circuitry (e.g., drivers, signal lines, control logic) for the sub-banks. It will be understood that channels, ranks, banks, or other organizations of the memory locations, and combinations of the organizations, can overlap physical resources. For example, the same physical memory locations can be accessed over a specific channel as a specific bank, which can also belong to a rank. Thus, the organization of memory resources will be understood in an inclusive, rather than exclusive, manner.

In one embodiment, the memory controller 1140 includes refresh (REF) logic 1141. In one embodiment, refresh logic 1141 indicates a location for refresh, and a type of refresh to perform. Refresh logic 1141 can trigger self-refresh within memory, and issue external refreshes by sending refresh commands to trigger the execution of a refresh operation.

In one embodiment, access circuitry 1131 of the circuit portion 1130 performs a refresh (e.g., reprogramming) of any of the accessed memory cells that were not refreshed during the read sequence. Therefore, a complete refresh of memory cells can be achieved as mostly a side effect of the memory read sequence with minimal additional refresh operations.

In an embodiment, the circuit portion can also be embedded in the memory controller, even if the present disclosure is not limited by a particular architecture.

In the exemplary embodiment illustrated in FIG. 11, the memory controller 1140 includes error correction circuitry 1142. The error detection/correction circuitry 1142 can include hardware logic to implement an error correction code (ECC) to detect errors occurring in data read from memory portion. In one embodiment, error detection/correction circuitry 1142 also corrects errors (up to a certain error rate based on the implemented ECC code). However, in other embodiments, error detection/correction circuitry 1142 only detects but does not correct errors.

In the illustrated embodiment, the memory controller 1140 includes command (CMD) logic 1143, which represents logic or circuitry to generate commands to send to memory portion. The memory controller 1140 may also include a counter 1144, such as the per-codeword counter disclosed above and configured to count the number of bits switched during the read operation. Clearly, also other architectures can be employed, for example the counter can be embedded in the host 1150 or also in the circuit portion 1130.

Based on the received command and address information, access circuitry 1131 of the circuit portion 1130 performs operations to execute the commands, such as the read sequence of the present disclosure. In one such embodiment, the circuit portion 1130 includes sense circuitry 1132 to detect electrical responses of the one or more memory cells to the first voltage and the second voltage. In one embodiment, the sense circuitry 1132 include sense amplifiers. Figure illustrates the access circuitry 1131 and sense circuitry 1132 as being embedded in the memory portion 1100', however, other embodiments can include access circuitry and/or sense circuitry that is separate from the memory portion 1100'. For example, access circuitry and sense circuitry can be included in a memory controller such as the memory controller 1140.

In one embodiment, memory portion 1100' includes one or more registers 1133. The registers 1133 represent one or more storage devices or storage locations that provide configuration or settings for the operation of the memory portion.

Furthermore, in one embodiment, the circuit portion 1130 includes also decode circuitry 1134.

The host device 11500 represents a computing device in accordance with any embodiment described herein, and can be a laptop computer, a desktop computer, a server, a gaming or entertainment control system, a scanner, copier, printer, routing or switching device, embedded computing device, or other electronic device such as a smartphone. The memory device 1110 may also be embedded in the host device 1150.

In one embodiment, the system 1100 includes an interface 1170 coupled to the processor 1160, which can represent a higher speed interface or a high throughput interface for system components that needs higher bandwidth connections, and/or graphics interface components. Graphics interface interfaces to graphics components for providing a visual display to a user of system 1100. In one embodiment, graphics interface generates a display based on data stored in the memory device or based on operations executed by processor or both.

The system may also comprise network interface 1180 communicatively coupled to the host or to memory device for example for connecting with other systems, and/or a battery coupled to provide power to said system.

In conclusion, an example method for reading memory cells according to the present disclosure comprises the steps of applying a first read voltage to a plurality of memory cells, detecting first threshold voltages exhibited by the plurality of memory cells in response to application of the first read voltage, based on the first threshold voltages, associating a first logic state to one or more cells of the plurality of memory cells, applying a second read voltage to the plurality of memory cells, wherein the second read voltage has the same polarity of the first read voltage and a higher magnitude than an expected highest magnitude for said first threshold voltages, detecting second threshold voltages exhibited by the plurality of memory cells in response to application of the second read voltage, based on the second threshold voltages, associating a second logic state to one or more cells of the plurality of memory cells, applying a third read voltage to the plurality of memory cells, wherein the third read voltage has the same polarity of the first and second read voltages and is applied at least to a group of memory cells that, during the application the second read voltage, have been reprogrammed to an opposite logic state, detecting third threshold voltages exhibited by the plurality of memory cells in response to application of the third read voltage, and, based on the third threshold voltages, associating one of the first or second logic state to one or more of the cells of the of the plurality of memory cells. A circuit portion, including access circuitry to apply the read voltages and to determine the logic states, and sense circuitry to detect the threshold voltages, is also disclosed to perform the above operations.

According to an embodiment, the memory cells exhibit a threshold voltage with a higher magnitude when the memory cell is in the second logic state, and a threshold voltage with a lower magnitude when the memory cell is in the first logic state, and wherein a logic state of a given cell is determined based on whether the memory cell exhibits a higher or lower magnitude threshold voltage in response to one of the applied read voltages.

According to an embodiment, the second read voltage is applied only to memory cells that where not determined to be in the first logic state after the application of the first read voltage.

According to an embodiment the third read voltage is applied only to memory cells that were not determined to be in the second logic state after the application of the second read voltage.

According to an embodiment the first threshold voltages are within a first range for cells of said plurality of memory cells programmed with a first polarity, the second threshold voltages are within a second range for cells of said plurality of memory cells programmed with a second polarity, and the first range and second range partially overlap.

According to an embodiment, the first read voltage is lower than an expected lowest threshold voltage of cells in the second logic state.

According to an embodiment, the second read voltage is higher than an expected highest threshold voltage of cells in the first logic state.

According to an embodiment, the third read voltage is higher than a highest expected threshold voltage of memory cells originally in the second logic state after the memory cells originally in the second logic state have been reprogrammed when applying the second read voltage.

According to an embodiment, a magnitude of the second read voltage is greater than a magnitude of the first read voltage.

According to an embodiment, a magnitude of the third read voltage is lower than a magnitude of the second read voltage.

According to an embodiment, the third read voltage is selected as the voltage that corresponds to a deterministic number of bits in a predefined state during the read operation, wherein the read voltage is increased from a starting voltage until the number of counted bits in the predefined state reaches a predetermined value.

According to an embodiment, the third read voltage is applied to the cells after a pre-determined waiting time.

Moreover, according to an embodiment, the sense circuitry is configured to detect a first current through a given memory cell in response to the first read voltage, wherein the access circuitry is configured to determine that the given memory cell is in the first logic state based on detection that a magnitude of the first current is greater than or equal to a first threshold current.

According to an embodiment, the sense circuitry is configured to detect a second current through the given memory cell in response to the second read voltage, wherein the access circuitry is configured to determine that the given memory cell is at the second logic state based on detection that a magnitude of the second current is less than a second threshold current.

According to an embodiment, the sense circuitry is configured to detect a third current through the given memory cell in response to the third read voltage, and wherein the access circuitry is configured to determine that the given memory cell is at the second logic state based on detection that a magnitude of the second current is greater than a third threshold current.

According to an embodiment, the access circuit is configured to mask the memory cells that have been assigned to a given logic state after the application of the first and/or the second read voltage.

According to an embodiment, the first read voltage applied by the access circuit has a lower magnitude than an expected lowest threshold voltage of memory cells in the second logic state and wherein the second read voltage applied by the access circuit has a higher magnitude than an expected highest threshold voltage of memory cells in the first logic state.

In the preceding detailed description, reference is made to the accompanying drawings that form a part hereof, and in which is shown, by way of illustration, specific examples. In the drawings, like numerals describe substantially similar components throughout the several views. Other examples may be utilized, and structural, logical and/or electrical changes may be made without departing from the scope of the present disclosure. In addition, as will be appreciated, the proportion and the relative scale of the elements provided in the figures are intended to illustrate the embodiments of the present disclosure and should not be taken in a limiting sense.

As used herein, "a," "an," or "a number of" something can refer to one or more of such things. A "plurality" of something intends two or more. As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

The invention claimed is:

1. A method for reading memory cells, comprising:
applying a first read voltage to a plurality of memory cells;
detecting first threshold voltages exhibited by the plurality of memory cells in response to application of the first read voltage;
based on the first threshold voltages, associating a first logic state to one or more memory cells of the plurality of memory cells;
applying a second read voltage to the plurality of memory cells, wherein the second read voltage has a same polarity of the first read voltage;
detecting second threshold voltages exhibited by the plurality of memory cells in response to application of the second read voltage;
based on the second threshold voltages, associating a second logic state to one or more memory cells of the plurality of memory cells;
applying a third read voltage to the plurality of memory cells, wherein the third read voltage has the same polarity of the first and second read voltages and is applied at least to a group of memory cells that, during the application the second read voltage, have been reprogrammed to an opposite logic state;
detecting third threshold voltages exhibited by the plurality of memory cells in response to application of the third read voltage; and
based on the third threshold voltages, associating one of the first or second logic state to one or more memory cells of the plurality of memory cells.

2. The method of claim 1, wherein the memory cells exhibit a threshold voltage with a higher magnitude when a memory cell is in the second logic state, and a threshold voltage with a lower magnitude when the memory cell is in the first logic state, and wherein a logic state of a given memory cell is determined based on whether the given memory cell exhibits a higher or lower magnitude threshold voltage in response to one of the applied read voltages.

3. The method of claim 1, wherein the second read voltage is applied only to memory cells that where not determined to be in the first logic state after the application of the first read voltage.

4. The method of claim 3, wherein the third read voltage is applied only to memory cells that were not determined to be in the second logic state after the application of the second read voltage and that where programmed to an opposite logic state.

5. The method of claim 1, wherein the first threshold voltages are within a first range for memory cells of said plurality of memory cells programmed with a first polarity, wherein the second threshold voltages are within a second range for memory cells of said plurality of memory cells programmed with a second polarity, and wherein the first range and the second range partially overlap.

6. The method of claim 1, wherein the first read voltage is lower than an expected lowest threshold voltage of cells in the second logic state.

7. The method of claim 6 wherein the second read voltage is higher than an expected highest threshold voltage of cells in the first logic state.

8. The method of claim 7, wherein the third read voltage is higher than a highest expected threshold voltage of memory cells originally in the second logic state after the memory cells originally in the second logic state have been reprogrammed when applying the second read voltage.

9. The method of claim 1, wherein a magnitude of the second read voltage is greater than a magnitude of the first read voltage.

10. The method of claim 1, wherein a magnitude of the third read voltage is lower than a magnitude of the second read voltage.

11. The method of claim 1, wherein the third read voltage is selected as the voltage that corresponds to a deterministic number of bits in a predefined state during a read operation, wherein the third read voltage is increased from a starting voltage until the number of counted bits in the predefined state reaches a predetermined value.

12. The method of claim 1, wherein the third read voltage is applied to the memory cells after a pre-determined waiting time.

13. A circuit for reading memory cells, comprising:
an access circuit configured to:
apply a first read voltage to a plurality of memory cells;
apply a second read voltage to the plurality of memory cells, wherein the second read voltage has a same polarity of a polarity of the first read voltage; and
apply a third read voltage to the plurality of memory cells, wherein the third read voltage has the same polarity of the first and second read voltages and is applied at least to a group of memory cells that, during the application the second read voltage, have been reprogrammed to an opposite logic state,
a sense circuit configured to:
detect first threshold voltages exhibited by the plurality of memory cells in response to application of the first read voltage;
detect second threshold voltages exhibited by the plurality of memory cells in response to application of the second read voltage; and
detect third threshold voltages exhibited by the plurality of memory cells in response to application of the third read voltage,
wherein the access circuit is further configured to:
based on the first threshold voltages detected by the sense circuit, associate a first logic state to one or more memory cells of the plurality of memory cells;
based on the second threshold voltages detected by the sense circuit, associate a second logic state to one or more memory cells of the plurality of memory cells; and
based on the third threshold voltages detected by the sense circuit, associate one of the first or second logic state to one or more memory cells of the plurality of memory cells.

14. The circuit of claim 13, wherein the sense circuit is configured to detect a first current through a given memory cell in response to the first read voltage, wherein the access circuit is configured to determine that the given memory cell is in the first logic state based on detection that a magnitude of the first current is greater than or equal to a first threshold current.

15. The circuit of claim 14, wherein the sense circuit is configured to detect a second current through the given memory cell in response to the second read voltage, wherein the access circuit is configured to determine that the given memory cell is at the second logic state based on detection that a magnitude of the second current is less than a second threshold current.

16. The circuit of claim 15, wherein the sense circuit is configured to detect a third current through the given memory cell in response to the third read voltage, and wherein the access circuit is configured to determine that the given memory cell is at the second logic state based on detection that a magnitude of the second current is greater than a third threshold current.

17. The circuit of claim 13, wherein the access circuit is configured to mask the memory cells that have been assigned to a given logic state after the application of the first and/or the second read voltage.

18. The circuit of claim 13, wherein the first read voltage applied by the access circuit has a lower magnitude than an expected lowest threshold voltage of memory cells in the second logic state and wherein the second read voltage applied by the access circuit has a higher magnitude than an expected highest threshold voltage of memory cells in the first logic state.

19. A memory device, comprising:
an array of memory cells, and
a circuit portion for reading the memory cells, the circuit portion being operatively coupled with the array of memory cells and comprising at least:
an access circuit configured to:
apply a first read voltage to a plurality of memory cells;
apply a second read voltage to the plurality of memory cells, wherein the second read voltage has a same polarity as a polarity of the first read voltage; and
apply a third read voltage to the plurality of memory cells, wherein the third read voltage has the same polarity of the first and second read voltages and is applied at least to a group of memory cells that, during the application the second read voltage, have been reprogrammed to an opposite logic state,
a sense circuit configured to:
detect first threshold voltages exhibited by the plurality of memory cells in response to application of the first read voltage;
detect second threshold voltages exhibited by the plurality of memory cells in response to application of the second read voltage; and
detect third threshold voltages exhibited by the plurality of memory cells in response to application of the third read voltage,
wherein the access circuit is further configured to:
based on the first threshold voltages detected by the sense circuit, associate a first logic state to one or more memory cells of the plurality of memory cells;
based on the second threshold voltages detected by the sense circuit, associate a second logic state to one or more memory cells of the plurality of memory cells; and
based on the third threshold voltages detected by the sense circuit, associate one of the first or second logic state to one or more memory cells of the plurality of memory cells.

20. The memory device of claim 19, including a counter configured to count a number of bits switched during the application of the first, second and/or third read voltages, wherein the access circuit is configured to apply an increasing read voltage until the number of counted switched bits reaches a predetermined value.

21. The memory device of claim 19, wherein the array of memory cells comprises a Self-Selecting Memory (SSM) or a 3D cross point (3D X Point) memory.

22. The memory device of claim 19, further comprising a memory controller configured to generate memory access commands.

23. A system comprising:
a host device; and
a memory device according to claim 19 and operatively coupled with the host device.

24. The system of claim 23, further comprising any of a display communicatively coupled to the memory device or to the host device, a network interface communicatively coupled to the memory device or to the host device, and a battery coupled to provide power to said system.

* * * * *